US005292995A

United States Patent [19]

Usa

[11] Patent Number: 5,292,995

[45] Date of Patent: Mar. 8, 1994

[54] METHOD AND APPARATUS FOR CONTROLLING AN ELECTRONIC MUSICAL INSTRUMENT USING FUZZY LOGIC

[75] Inventor: Satoshi Usa, Hamamatsu, Japan

[73] Assignee: Yamaha Corporation, Hamamatsu, Japan

[21] Appl. No.: 440,869

[22] Filed: Nov. 22, 1989

[30] Foreign Application Priority Data

| | | | |
|---|---|---|---|
| Nov. 28, 1988 | [JP] | Japan | 63-301486 |
| Nov. 28, 1988 | [JP] | Japan | 63-301487 |
| Nov. 28, 1988 | [JP] | Japan | 63-301488 |
| Nov. 28, 1988 | [JP] | Japan | 63-301489 |
| Nov. 28, 1988 | [JP] | Japan | 63-301490 |
| Nov. 28, 1988 | [JP] | Japan | 63-301491 |

[51] Int. Cl.[5] .......... G10H 5/07; H03G 3/00

[52] U.S. Cl. .......... 84/626; 395/900

[58] Field of Search .......... 84/600, 601, 602, 604, 84/615, 622, 625–627, 629, 647; 395/3, 900, 902

[56] References Cited

U.S. PATENT DOCUMENTS

| | | | |
|---|---|---|---|
| 4,082,028 | 4/1978 | Deutsch | 84/625 |
| 4,620,286 | 10/1986 | Smith et al. | 364/513 |
| 4,864,490 | 9/1989 | Nomoto et al. | 364/157 |
| 4,893,538 | 1/1990 | Masaki et al. | 84/605 |
| 4,930,084 | 5/1990 | Hosaka et al. | 364/426.04 |
| 4,957,030 | 9/1990 | Suzuki | 84/604 |
| 4,961,225 | 10/1990 | Hisano | 380/28 |
| 4,967,129 | 10/1990 | Tanaka | 318/621 |
| 5,109,746 | 5/1992 | Takauji et al. | 84/607 |
| 5,138,924 | 8/1992 | Ohya et al. | 84/604 |
| 5,138,928 | 8/1992 | Nakajima et al. | 84/635 |

OTHER PUBLICATIONS

Chiu, Stephen and Togai, Masaki, "A Fuzzy Logic Programming Environment For Real-Time Control", International Journal of Approximate Reasoning, 1988; 2:163–175.

Yamakawa, Takeshi, "High Speed Fuzzy Controller Hardware System: The Mega-FIPS Machine", Information Sciences 45, 113–128, 1988.

*Primary Examiner*—Bernard Roskoski

*Assistant Examiner*—Jeffrey W. Donels

*Attorney, Agent, or Firm*—Graham & James

[57] ABSTRACT

Tone control of an electronic musical instrument is provided using fuzzy inferences for determining musical tone control parameters such as pitch, sounding level, effect, overtone composition, playing methods, etc. Several different kinds of play information are derived from controls operated by the performer and selectively taken into account using fuzzy inference rules to derive the musical tone control parameters. Several different types of play information, such as initial touch, after touch, key-on time, etc., may thus be combined to provide delicate nuances to the musical performance providing a more natural sounding tone and providing the capability to give the musical tone an expression corresponding to a method or technique of a musical performance.

18 Claims, 26 Drawing Sheets

METHOD AND APPARATUS FOR CONTROLLING AN ELECTRONIC MUSICAL INSTRUMENT USING FUZZY LOGIC

BACKGROUND OF THE INVENTION

1. Field of the Invention

This invention relates to a method of controlling a musical tone by controlling the parameters used for the generation of musical tones or the parameters used for the output of musical tones in the electronic musical instrument designed to electronically generate and output the musical tone.

2. Description of the Prior Art

At present various electronic musical instruments designed to electronically generate musical tones are available. In addition to the popular keyboard type musical instruments, electronic wind instruments and electronic stringed instruments (guitar type) are also available. These electronic musical instruments have various controls (for example, key switches). When the controls are operated (played), the musical tone generated is controlled based on the play information. For example, the keyboard type electronic musical instrument is provided with a keyboard of about 4 to 7.5 octaves as a control section (each key corresponds to semitone sound pitch C, C#, D, Eb . . . ), a key-on sensor for detecting ON-OFF of a key for each key, an initial touch sensor for detecting the key touch intensity (initial touch), and an after-touch sensor for detecting the key depress intensity (after-touch). Moreover, in addition to the keyboard, this musical instrument is provided also with a pedal and a wheel type control section. The wind instrument type electronic musical instrument is provided with a key system similar to that of a wood-wind instrument as a control section, a mouth piece, a sensor for detecting the operation state of each key, a breath sensor for detecting the intensity of blow-in air and a lip sensor for detecting the pressure applied to the reed. The following musical tone elements are controlled based on the play information obtained from the above-mentioned control section.

Sound pitch: Pitch of sound (absolute sound name);

Pitch: Insignificant change of frequency at the same sound pitch;

Sounding level: Sound volume;

Envelope: Change of sounding level due to attack or decay;

Vibrato: Periodic change of pitch;

Tremolo: Periodic change of sounding level;

Reverb: Reverberation after key-off; and

Overtone: Harmonic overtone of musical tone (brightness-calmness of sound changes depending on the ratio of high-order overtone component).

These musical tone control parameters are specified. These musical tone control parameters are used to control the sound source section to output the sound, generating expressive musical tones. The electronic musical instrument having such a configuration is sometimes required to give delicate expression to the musical tone so as to enhance the play effect. For this purpose one musical tone control parameter is conventionally controlled by using several types of play information.

For example, the following are musical tone control parameters and the play information therefor.

Vibrato (periodic change of pitch (frequency) of musical tone): After-touch, modulation wheel information, key-on time, breath intensity, etc.

Tremolo (periodic change of sound level (volume)): After-touch, modulation wheel information, key-on time, breath intensity, etc.

Reverb: After-touch, etc.

Pitch: After-touch, breath intensity, pitch bend wheel information, etc.

Overtone: Initial touch, after-touch, key-on time, modulation wheel information, etc.

However, in the case when one musical tone control parameter is specified based on several types of play information in the conventional electronic musical instrument, the control value is individually determined based on each play information and one musical tone control parameter is specified by adding or multiplying these control values. Such a parameter specifying system requires specifying individual control values for each play information and needs a long time for arithmetic operation, resulting in delayed sounding. Moreover, in the case when the sum (or product) of several control values is excessively large, it cannot be suppressed, and thus excessive control is performed, resulting in an unfavorable sounding of musical tones.

To express the nuance similar to that obtained from the natural musical instrument by using the electronic musical instrument, the musical tone must be controlled by the total arithmetic operation of various types of play information. If this arithmetic operation is performed by applying the conventional control for each play information and the general algorithm program, the arithmetic operation takes too long a time so that the conventional method cannot be applied for practical use. If the operation speed of the arithmetic operation equipment is increased, its size is increased and its price rises. The available expression methods for musical instrument playing are the method of adjusting the note value and sound link such as legato, tenuto, staccato, etc.; the method of increasing and decreasing the sound level such as crescendo and decrescendo; and the method of changing the tempo such as retardando and accelerand, etc. The conventional electronic musical instruments are designed so that these effects are generally expressed by the manual operation of the player. For example, the effect of tenuto is expressed by gradually intensifying the after-touch, while the effect of decrescendo is expressed by gradually reducing the after-touch.

In some cases, however, the mechanism of the playing control section and the function of the sensor are insufficient to accept the intention of the player (for instance, a player could not apply portamento of the required speed when playing the keyboard type electronic musical instrument). The conventional electronic musical instrument is unable to express the play which cannot be detected by the sensor or the playing control section or can express only the preset play. Accordingly, they could not give expressive musical tones.

In the case when the player does not have a sufficient playing skill yet to express the specific playing method (for example, if the player is unable to express sufficiently vibrato or pitchvendo with after-touch and breath control), the intended effects are perceived as unstable sound volume or pitch deviation by the listeners, thereby resulting in improper sound tone. The conventional electronic musical instrument does not have a function to compensate for it, as a result of which improper musical tone is emitted. This is a defect of the conventional electronic musical instrument.

SUMMARY OF THE INVENTION

In brief, this invention has been elaborated with due regard to the conventional technologies concerned. It is accordingly an object of this invention to provide a musical tone control method for the electronic musical instrument which is capable of controlling simply and rapidly the musical tone pitch, effects (vibrato, etc.), overtone and sounding level by composing the instrument so as to generate various musical tone control parameters according to fuzzy inference based on the play information.

Another object of this invention is to provide a musical tone control method for the electronic musical instrument which is capable of controlling the musical tone control suited for a playing method by detecting this playing method according to fuzzy inference based on the play information.

If the musical tone control parameter is determined by using the fuzzy inference, the fine musical tone control can be performed, taking totally into consideration several types of playing information. Even in this case the composition of the instrument does not become complicated and the processing speed is not lowered. Moreover, since the fuzzy rule and membership function can be changed easily, the musical instrument manufacturer and the player can easily give specific nature to each musical instrument as required.

BRIEF DESCRIPTION OF THE DRAWINGS

FIG. 1 is a block diagram of a keyboard type electronic musical instrument to which the musical tone control method of this invention is applied.

FIGS. 2 (A) to (D) are block diagrams of the musical tone control parameter inferring circuits for the electronic musical instrument. They generate the pitch parameter, vibrato parameter, fluctuation parameter, sounding level parameter.

FIGS. 3 (A) to (D) show the membership functions which are used in the conditional section of the musical tone control parameter inferring circuits.

FIGS. 4 (A) to (D) show the membership functions which are used for the conclusion section of the musical tone control parameter inferring circuit.

FIG. 5, FIG. 6 and FIG. 7 show how the musical tone is controlled by the keyboard operation of the keyboard type electronic musical instrument.

FIGS. 5 (A) to (F) show the total change of control value (frequency and sounding level) which is caused by the key operation.

FIG. 6 (A) and FIG. 6 (B) show the change of the pitch parameter which is caused by the keyboard operation.

FIG. 7 (A) and FIG. 7 (B) show the change of the sounding level parameter which is caused by the keyboard operation.

FIGS. 8 (A) to (E) are flow charts showing the operations in the case when the pertinent operation section of the musical tone control parameter inferring circuit is composed of a microcomputer.

FIG. 9 is a block diagram showing a keyboard type electronic musical instrument to which the musical tone control method of this invention, especially the overtone control method, is applied.

FIG. 10 is a block diagram of an overtone control parameter generating circuit for this electronic musical instrument.

FIGS. 11 (A) to (D) show the membership functions which are used in the conditional section and the conclusion section of the overtone control parameter generating circuit.

FIG. 13 is a block diagram of a circuit for inferring the playing method.

FIGS. 14 (A) to (C) show the membership functions for inferring the extent of legato.

FIG. 15 (A) to FIG. 15 (C) show the membership functions for inferring the extent of tenuto.

FIG. 16 (A) to FIG. 16(C) show the membership functions for inferring the extent of staccato.

FIG. 17 (A) to FIG. 17 (D) show the relation between the key touch and the sounding level.

FIG. 18 explains the general procedure of the fuzzy inference method.

DESCRIPTION OF THE PREFERRED EMBODIMENT

Below is given at first a fuzzy inference method which is applied in the present invention.

The fuzzy inference method is executed as to "how the musical tone control parameters are set based on various types of play information". Consequently, several fuzzy rules are specified. Generally, the fuzzy rule is expressed as follows:

if (x=A, y=B, . . . ) then (u=R)

This invention applies the fuzzy rules to express the favorable operation characteristics for the purpose of giving the specific operation characteristics to the electronic musical instrument. The examples are the following:

"If the initial touch (x) is significant (A) and the after-touch (y) is significant (B), then pitch (u) is significantly increased (R)".

"If the initial touch (x) is insignificant (A) and the after-touch (y) is insignificant (B), then the pitch (u) is reduced insignificantly (R)".

"If the initial touch (x) is significant (A), the after-touch (y) is insignificant (B) and the key-on time (z) is long (C), then the pitch (u) is not changed (R)".

"If the after-touch (x) is significant (A) and the key on time (y) is long (B), then the significant vibrato (u) is given (R)".

"If the initial touch (x) is insignificant (A) and the key-on time (y) is long (B), then the reverb (u) is prolonged (R)".

"If the initial touch (x) is significant, the after-touch (y) is insignificant (B) and the key-on time (z) is short (C), then the reverb (u) is not given (R)".

"If the initial touch (x) is significant (A) and the after-touch (y) is significant (B), then the level (u) is increased (R)".

"If the initial touch (x) is insignificant (A) and the after-touch (y) is insignificant (B), then the level (u) is reduced (R)".

"If the initial touch (x) is significant (A), the after-touch (y) is significant (B), and the key-on time (z) is short (C), then the level (u) is increased significantly (R)".

Figure 18:
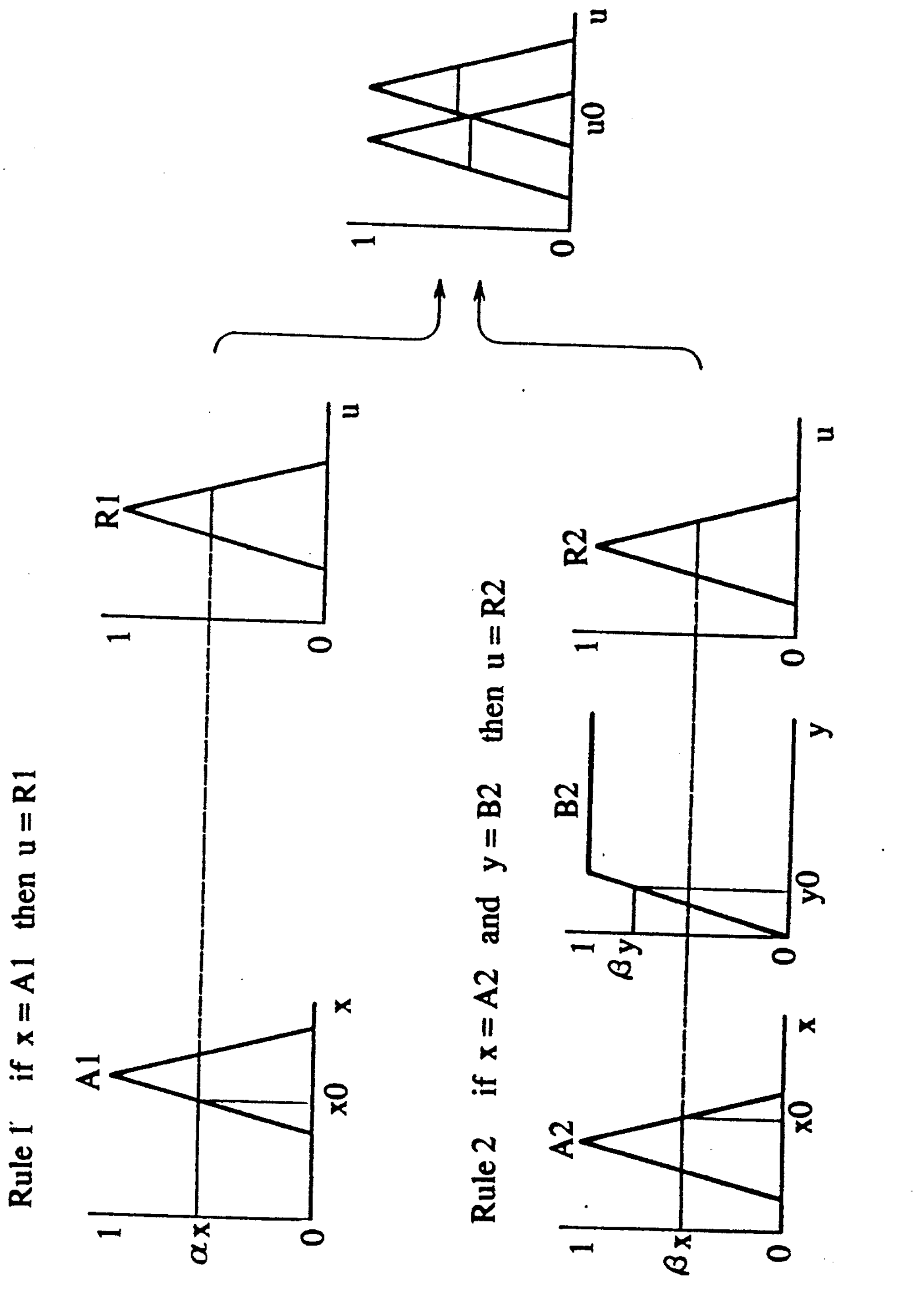

Below is given an explanation of the system of real inference based on these rules, referring to FIG. 18. This system is called the min-max rule. In this example, the inference based on the two fuzzy rules "if (x=A1) then (u=R1), if (x=A2, y=B2) then (u=R2)" is explained. Each proposition (x=A1, x=A2, y=B2, u=R1, u=R2) is expressed by the membership function. The membership function of the conditional section (proposition following the "if") is a function for determining the function value (membership value : x, x, y) indicating at what extent the variable (xo, yo) to be inputted belongs to the specific fuzzy set (A1, A2, B2). The output of conditional section is minimum (x, x) among all obtained membership values. The membership function of the conclusion section (proposition following the "then") is a function for outputting the conclusion of this rule. It is outputted as a value which has a spread in the direction of the control value (u-axis direction) limited (top-cut) by the output value of the conditional section. The final control value (u0) is a value of center of gravity of the value which is obtained by ORing the conclusions of several fuzzy rules.

Below is given an explanation of a keyboard type electronic musical instrument which is a first embodiment of the present invention to which the musical tone control method of the present invention is applied with reference to FIGS. 1 to 8.

Figure 1:
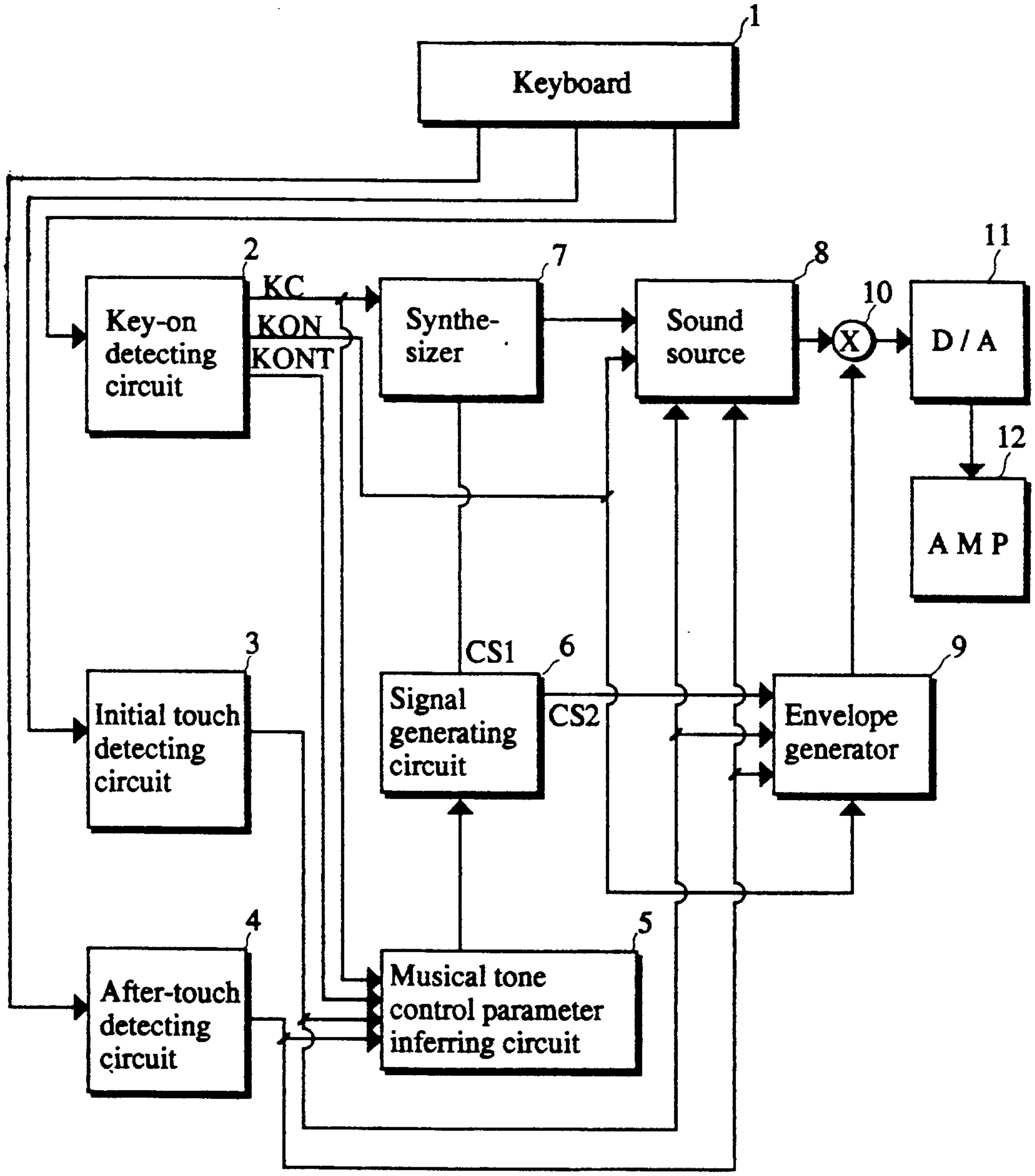
FIG. 1 to FIG. 8 show a first embodiment of the present invention.
Figure 19A:
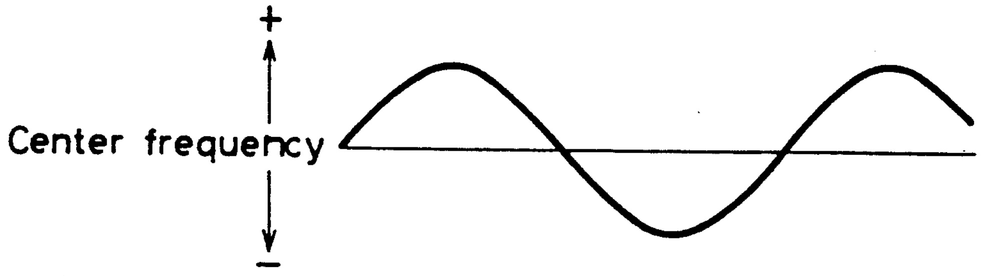
FIG. 19 (A) and FIG. 19 (B) explain the vibrato effect and the fluctuation effect.
Figure 19B:
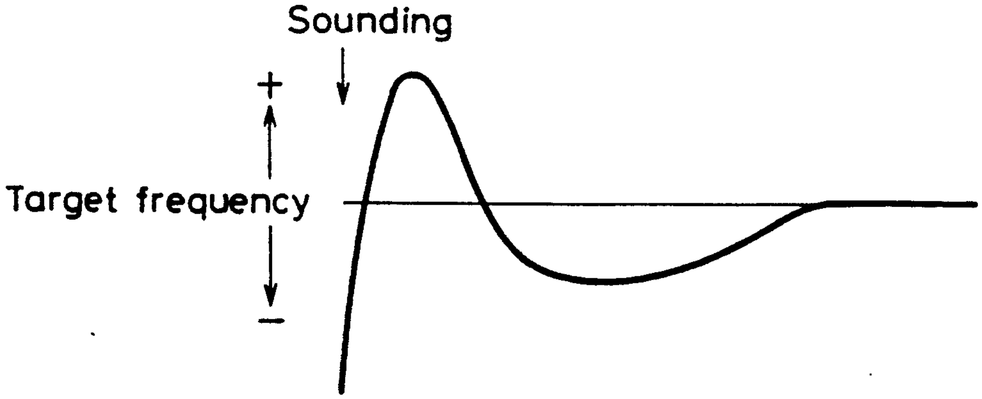

FIG. 1 is a block diagram of the keyboard type electronic musical instrument. This electronic musical instrument is capable of setting various musical tone control parameters such as pitch, vibrato, fluctuation effect and sounding level, etc. Here, vibrato is a periodic up-down change of pitch as shown in FIG. 19 (A) and gives a softening effect to the musical tone. The fluctuation is an unstable state of pitch just after sounding as shown in FIG. 19 (B). It gives an effect to simulate the features of a natural musical instrument.

A keyboard 1 has keys corresponding to various sound pitches. Each key is provided with a key-on sensor for detecting key ON/OFF, an initial touch sensor for detecting the initial touch intensity (speed), and an after-touch sensor for detecting the after-touch intensity. The initial touch sensor comprises two photosensors which are turned on successively according to the key-on operation. The key pressing speed is detected based on the key-on time difference. The photosensor which is later turned on serves as a key-on sensor. The state of these sensors is detected by a key-on detecting circuit 2, an initial touch detecting circuit 3 and an after-touch detecting circuit 4. The key-on detecting circuit 2 always monitors the ON/OFF state of each key, scanning the keyboard 1 (photosensors). If a key-on is found, it outputs the pertinent key code (a code indicating the sound pitch) KC, the key-on signal KON and the key-on time signal KONT.

The initial touch detecting circuit 3 detects the intensity of pressing of the pertinent key when a key-on is found and outputs a signal. The after-touch detecting circuit 4 detects the pressing force of the turned-on key. The key code KC is inputted into a musical tone control parameter inferring circuit 5 and a synthesizer 7. The key-on signal KON is inputted into a sound source circuit 8 and an envelope generator 9. The key-on time signal KONT is inputted into the musical tone control parameter inferring circuit 5. The initial touch intensity signal and the after-touch intensity signal are also inputted into the musical tone control parameter inferring circuit 5, sound source circuit 8 and envelope generator 9. The musical tone control parameter inferring circuit 5 outputs the musical tone control parameter to a signal generating circuit 6. The signal generating circuit 6 outputs the current pitch and level control values to the synthesizer 7 and the envelope generator 9. The musical tone control parameter inferring circuit 5 infers the pitch, vibrato, fluctuation and level based on the inputted signals and outputs the pertinent control parameter to the signal generating circuit 6. The signal generating circuit generates currently the frequency deviation signal CS1 and level deviation signal CS2, using these parameters, and outputs signals to the synthesizer 7 and envelope generator 9. The synthesizer 7 is a circuit which converts the inputted key code KC to a frequency signal (F number: Digital value representing the frequency.) and modulates this frequency signal with the above-mentioned frequency deviation signal CS1. This modulated frequency signal is integrated with the specific timing and inputted into the sound source circuit 8 as phase information. The sound source circuit 8 generates the digital (quantization) signal expressing the specific waveform (tone color) based on this phase information and inputs it into a multiplying circuit 10. The envelope generator 9 is connected to the multiplying circuit 10. The envelope generator 9 generates the basic envelope signal having attack and decay level waveforms based on the initial touch signal, after-touch signal and key-on time, and superposes the level deviation signal CS2 inputted from the signal generating circuit 6 on this basic envelope signal to generate the envelope signal. This envelope signal is inputted into the multiplying circuit 10. In the multiplying circuit 10 the above-mentioned digital signal is amplitude-modulated by the envelope signal inputted from the envelope generator 9 so that the musical tone envelope (level deviation) is given. The digital musical tone signal envelope is inputted into a D/A conversion circuit 11. In the D/A conversion circuit 11 the digital musical tone signal is sample-held and converted to an analog musical tone signal. The analog musical tone signal is inputted into an amplifier 12.

FIGS. 2 (A) to (D) are detailed block diagrams of the above-mentioned musical tone control parameter inferring circuit 5. FIG. 2 (A) shows a pitch parameter inferring circuit. FIG. 2 (B) shows a vibrato parameter inferring circuit. FIG. 2 (C) shows a fluctuation parameter inferring circuit. FIG. 2 (D) shows a level parameter inferring circuit. FIGS. 3 (A) to (D) show the membership functions of the conditional section which are used in the musical tone control parameter inferring circuit. The inferring circuit judges the status of the parameter according to a comparison between the membership functions and the detecting result. FIGS. 4 (A) to (D) show the membership functions of the conclusion section of the pitch parameter inferring circuit, vibrato parameter inferring circuit, fluctuation parameter inferring circuit, and level parameter inferring circuit, respectively.

The following inference is performed in the pitch parameter inferring circuit:

<<if "after-touch is not insignificant (AT2)", then "pitch is reduced insignificantly (PN)">> (1)

<<if "initial touch is not insignificant (IT3)" and "key-on time is extremely short", (hereinafter referred to as "soon after key-on (KOl)"), then "pitch is raised insignificantly (PP)">> (2)

<<if "after-touch is not insignificant (IT3)" nor "initial touch is not insignificant (AT2)" and "soon after key-on (K01)", then "pitch is not changed (PZ)">> (3)

The following inference is performed in the vibrato parameter inferring circuit:

<<if "after-pitch is not insignificant (AT2)" then "vibrato is applied significantly (VL)">> (4)

<<if "key-on time is long (K03)" then "vibrato is applied insignificantly (VS)">> (5)

<<if "initial touch is extremely insignificant (ITI)" and "soon after key-on time (KOl)" or "key-on time is not long (K03)", and "after-touch is insignificant (AT2)" then "vibrato is not applied (VZ)">> (6)

The following inference is performed in the fluctuation parameter inferring circuit:

<<if "key number is large (i.e., pitch is high: KN)" or "initial touch is not small (IT3)", then "fluctuation is applied significantly (YL)">> (7)

<<if "key number is small (i.e., pitch is low: KN) and initial touch is insignificant IT3)", then "fluctuation is applied insignificantly (YS)">> (8)

The following inferring is performed in the level parameter inference circuit:

<<if "initial touch is small (IT2)" and "after-touch is insignificant (AT1)", then "level is reduced (LS)">> (9)

<<if "initial touch is ordinary (IT4)" and "after-touch is ordinary (AT3)", then "level is not changed (LN)">> (10)

<<if "initial touch is significant (IT5)" and "key-on time is not extremely long (KO2)" and "after-touch is significant (AT4)", then "level is raised (LL)">> (11)

Based on these results the pitch parameter, vibrato parameter, fluctuation parameter and level parameter are set.

FIG. 3 (A) shows the membership functions "initial touch is extremely insignificant (IT1)", "initial touch is insignificant (IT2)", "initial touch is not insignificant (IT3)", "initial touch is ordinary (IT4)", and "initial touch is significant (IT5)". FIG. 3 (B) shows the membership functions "after-touch is insignificant (AT1)", "after-touch is not insignificant (AT2)", "after-touch is ordinary (AT3)", "after-touch is significant (AT4)". FIG. 3 (C) shows the membership functions "key-on time is extremely short (soon after key-on: KO1)", "key-on time is not extremely long (KO2)", and "key-on time is not short (KO3)". FIG. 3 (D) shows the membership function "key number is large (KN)". PN, PZ and PP of FIGS. 4 (A) to (D) are the membership functions corresponding to the conclusion section, namely "pitch is reduced insignificantly", "pitch is not changed", and "pitch is increased insignificantly". VL, VS, and VZ are the membership functions corresponding to "vibrato is applied significantly", "vibrato is applied insignificantly", "vibrato is not applied". YL and YS are the membership functions corresponding to "fluctuation is applied significantly", "fluctuation is applied insignificantly". LS, LN and LL are the membership functions corresponding to "level is reduced", "level is not changed", and "lěvel is increased".

A circuit as shown in FIGS. 2 (A) to (D) is composed so as to realize the above-mentioned fuzzy rules, using the above-mentioned membership functions.

Below is given an explanation of the configuration of the pitch parameter inferring circuit with reference to FIG. 2 (A). The membership function generating circuits (MFC: Membership Function Circuit) 101 to 103 are the circuits for generating the membership functions AT2, IT3 and KO1 of the conditional section. These circuits determine the relevant membership values, receiving the after-touch intensity signal, initial touch intensity signal and key-on time signal, respectively. The membership function generating circuits 108 to 110 are the circuits for generating the membership functions PN, PP and PZ of the conclusion section. The minimum circuits 111 to 113 are the circuits for inferring the conclusion of fuzzy rules (1) to (3) The minimum circuit 111 infers the conclusion of fuzzy rule (1), receiving the membership function and membership value of the membership function generating circuits 101 (conditional section) and 108 (conclusion section). The membership value of the membership functions 102 and 103 is inputted into the minimum circuit 104, a logical product (minimum) is determined, and the obtained value is inputted into the minimum circuit 112 as a value of conditional section of fuzzy rule (2). The membership function (PP) of the membership function generating circuit 109 is inputted into the minimum circuit 112. It infers the conclusion of fuzzy rule (2). The outputs of membership function generating circuit 101 and the minimum circuit 104 is ORed in the maximum circuit 106 (maximum is determined), and the obtained value is subtracted from "1" (complementary set is obtained) in the subtractor 109. This value is inputted into the minimum circuit 113 as a value of conditional section of fuzzy rule (3). The membership function (PZ) of the membership function generating circuit 110 is inputted into the minimum circuit 113. The conclusion of fuzzy rule (3) is inferred here. The three conclusions inferred by the minimum circuits 111, 112 and 113 are compared (ORed) in the maximum circuit 114, and at the same time an area is computed. The obtained OR figure and area are inputted into the center-of-gravity calculating circuit 115, and the center of gravity is determined by this center-of-gravity calculating circuit 115. The value indicating the position of the center of gravity is used as a pitch parameter.

Figure 2A:
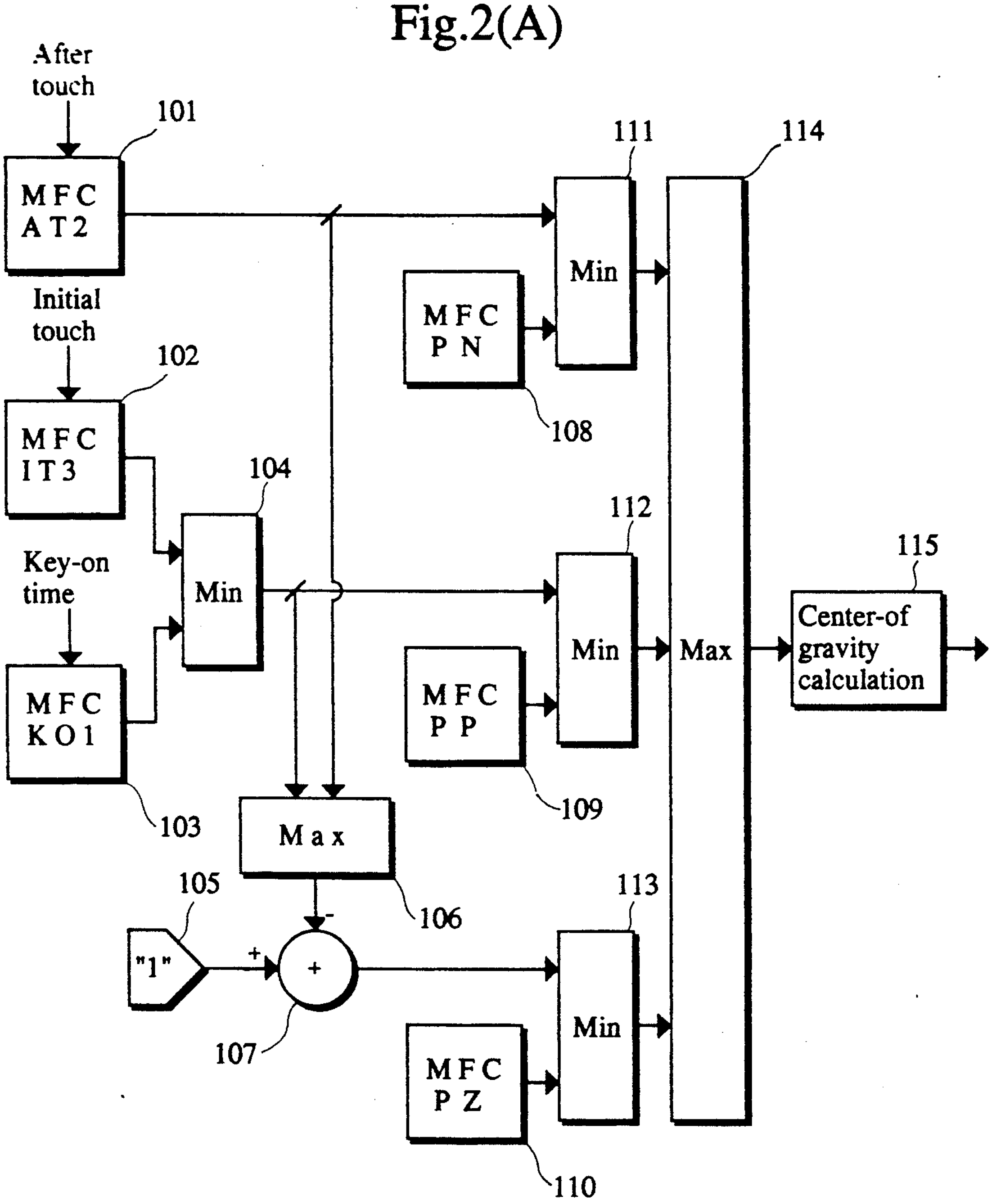
Figure 2B:
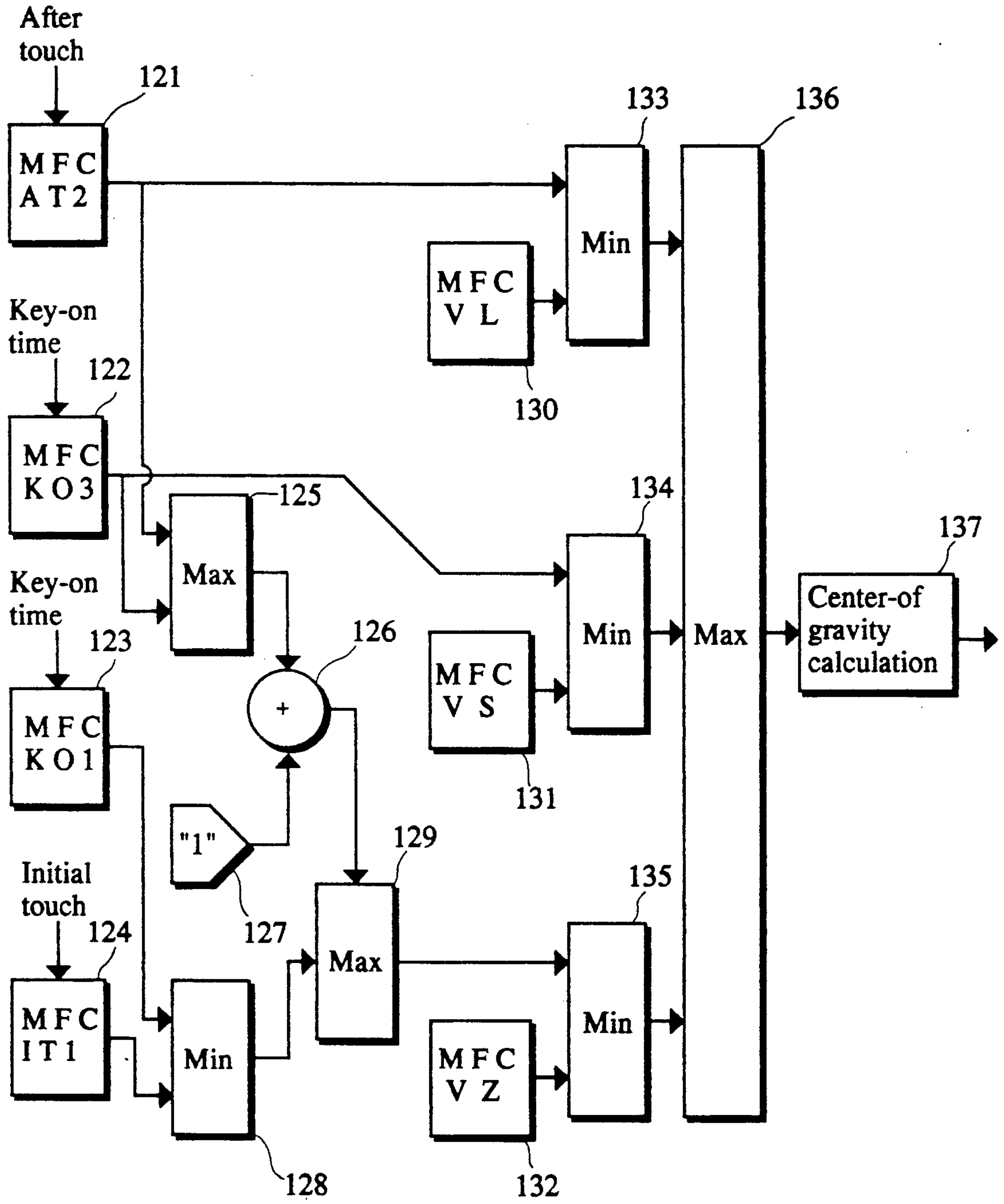
Figure 2C:
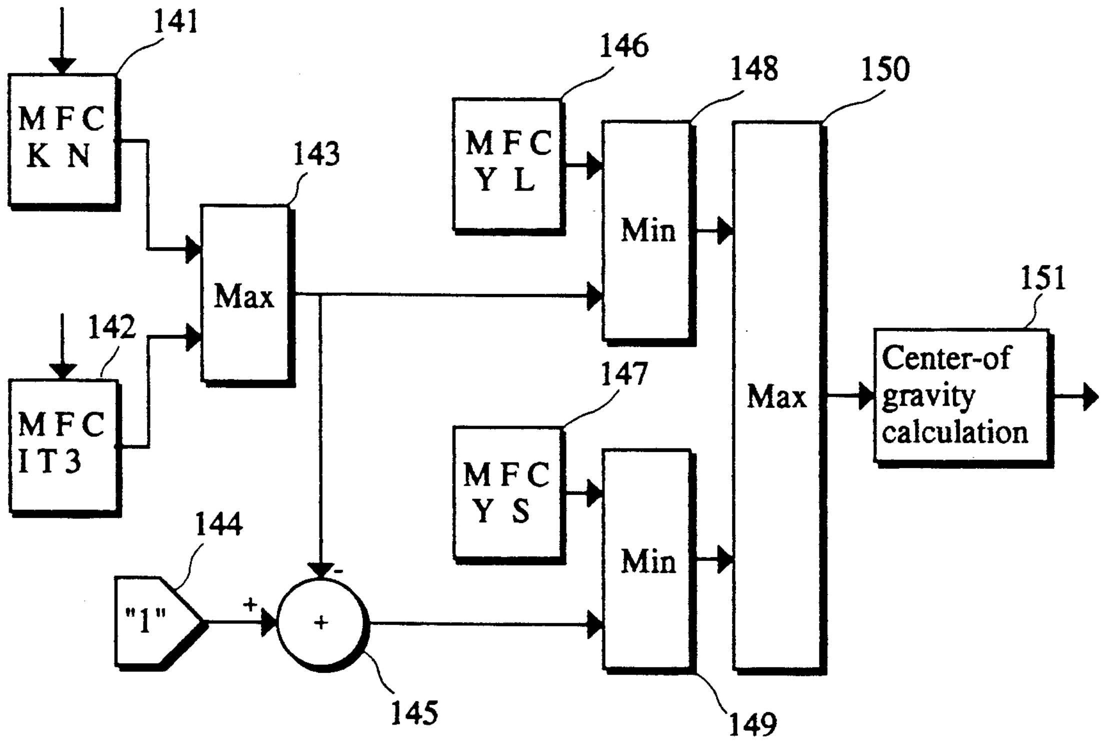
Figure 2D:
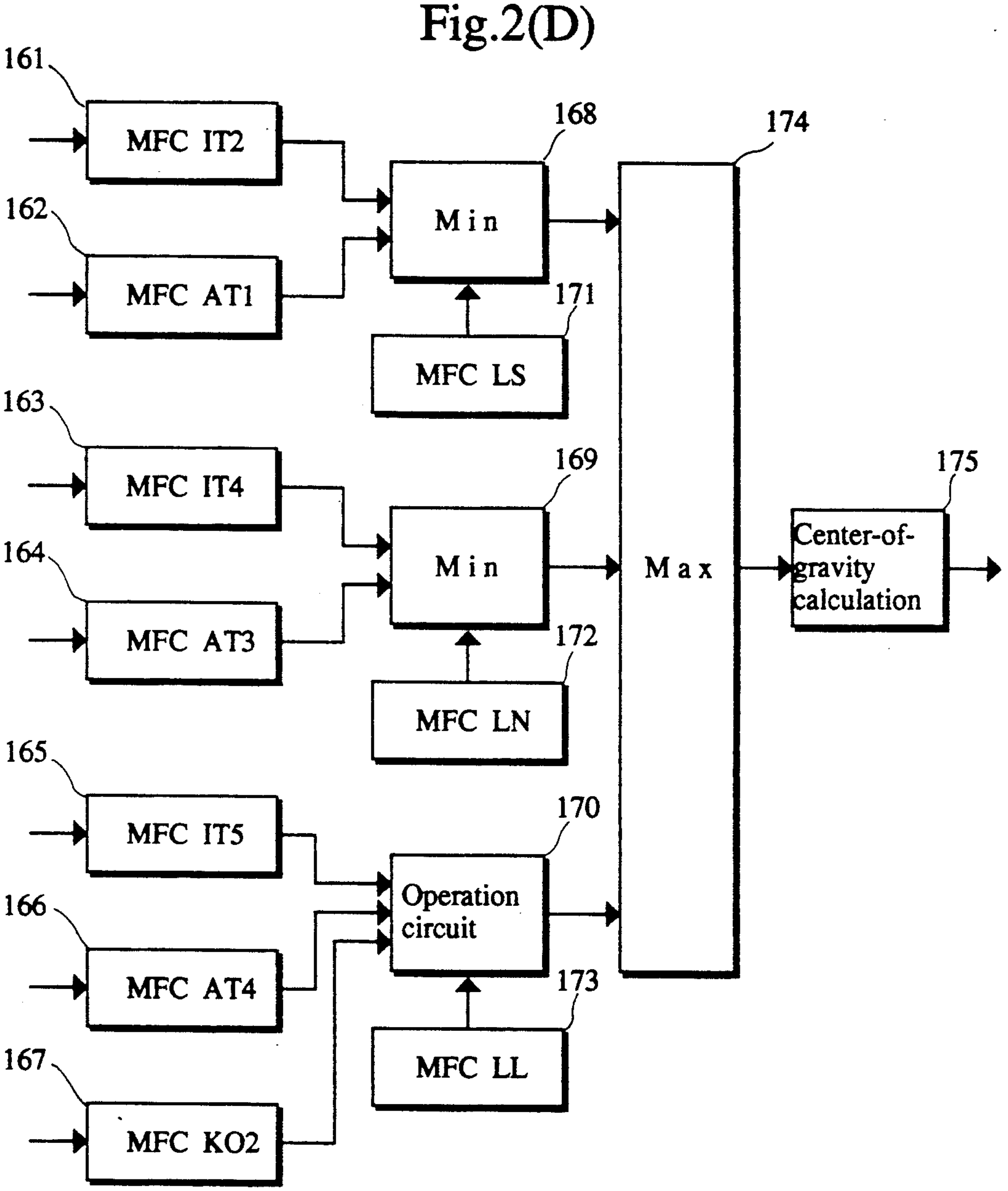
Figure 3A:
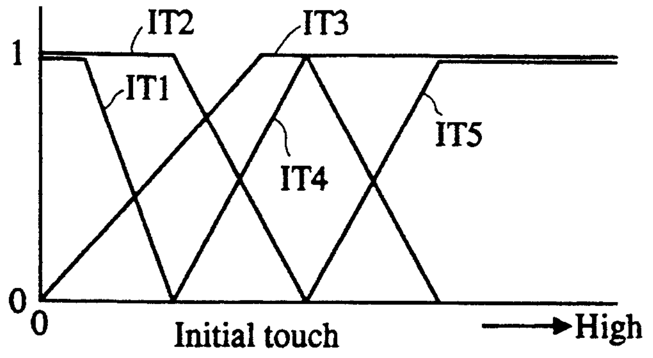
Figure 3B:
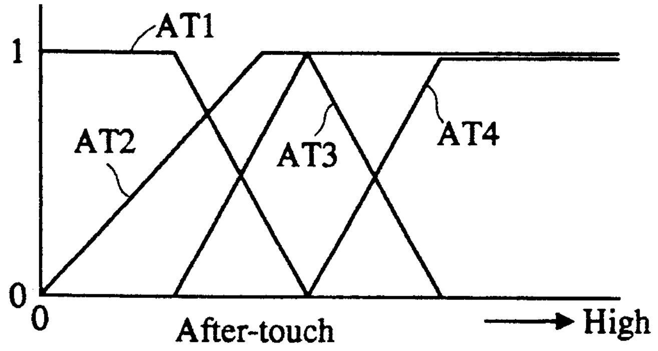
Figure 3C:
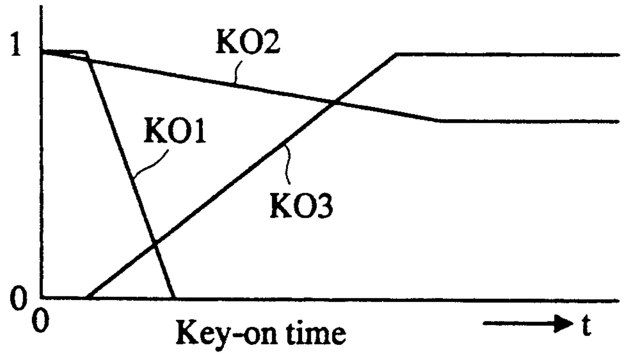
Figure 3D:
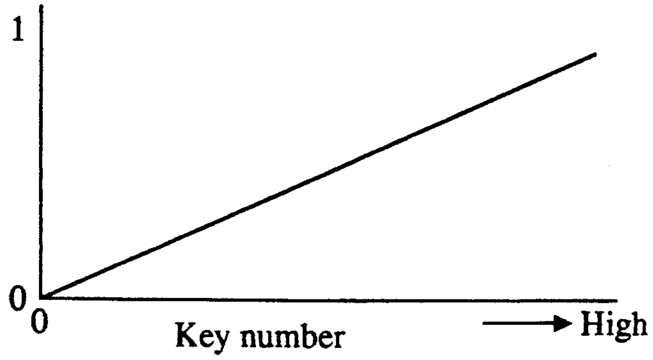
Figure 4A:
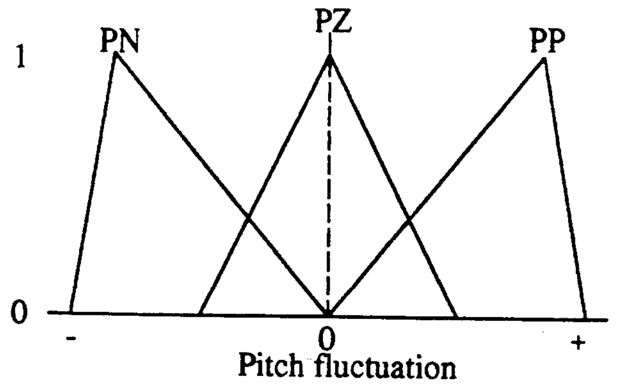
Figure 4B:
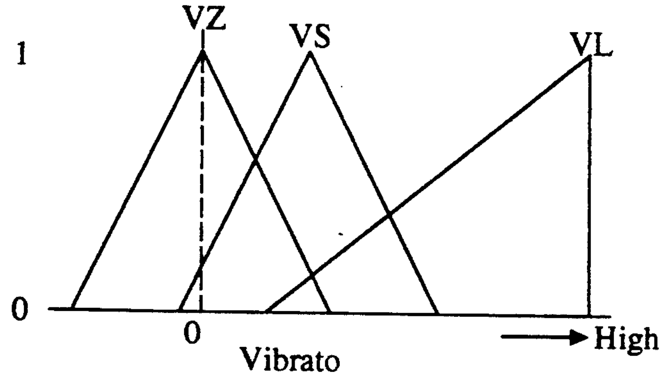
Figure 4C:
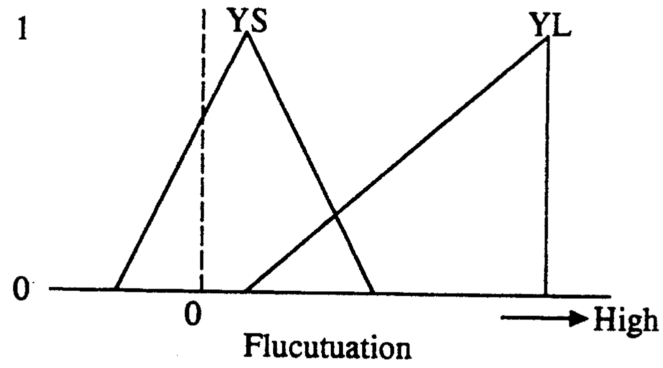
Figure 4D:
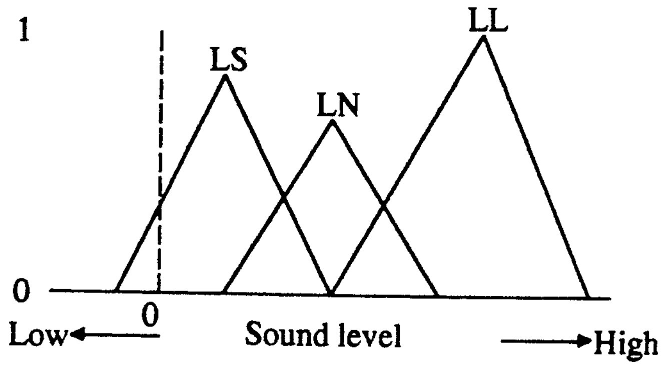
Figure 5A:
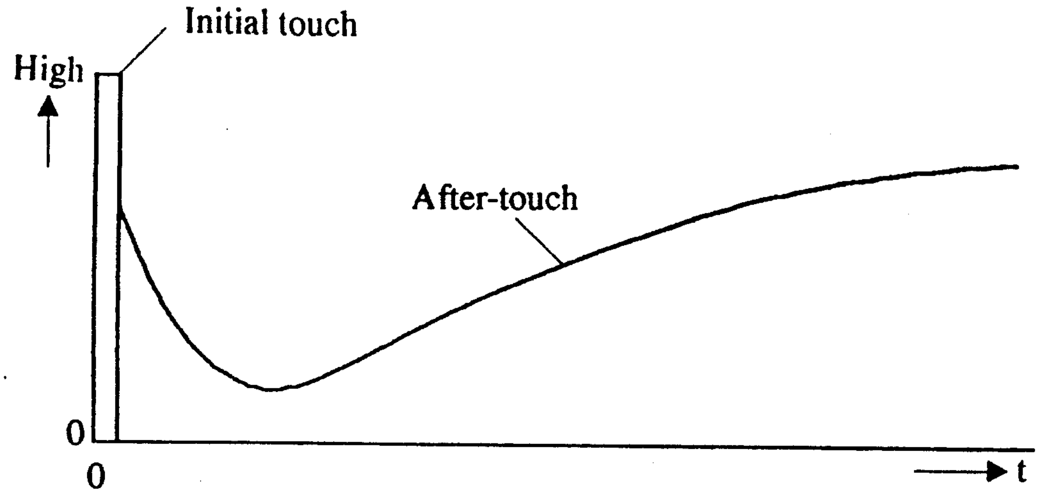
Figure 5B:
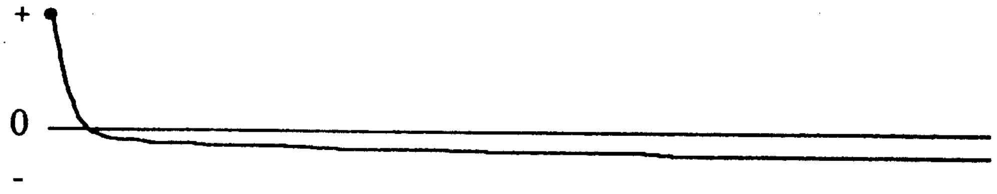
Figure 5C:
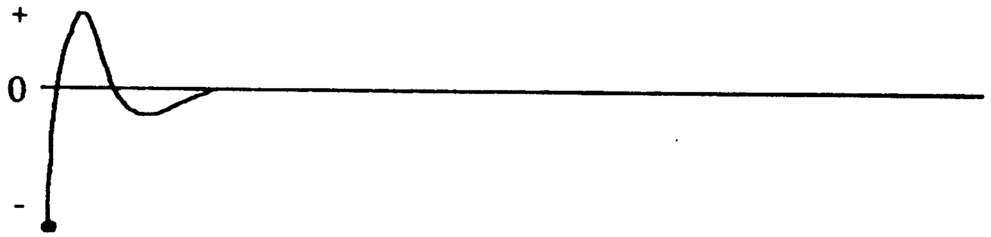
Figure 5D:
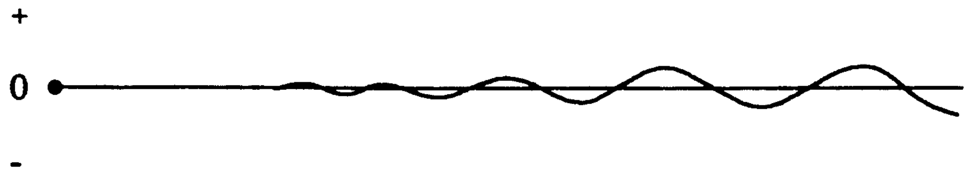
Figure 5E:
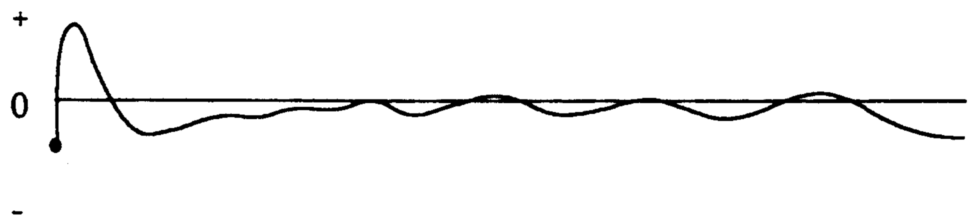
Figure 5F:

Below is given an explanation of the configuration of vibrato parameter inferring circuit with reference to FIG. 2(B). The membership function generating circuits 121 to 124 are the circuits for generating the membership functions AT2, KO3, KO1, and IT1 of the conditional section. These circuits determine the membership values, receiving the after-touch intensity signal, key-on time signal and initial touch intensity signal, respectively. The membership function generating circuits 130, 131 and 132 are the circuits for generating the membership functions VL, VS, and VZ of the conclusion section. The minimum circuits 133, 134 and 135 are the circuits for inferring the conclusions of fuzzy rules (4), (5) and (6) The minimum circuit 133 infers the conclusion of fuzzy rule (4), receiving the membership function and membership value of the membership function generating circuit 121 (conditional section) and 130 (conclusion section). The minimum circuit 134 infers the conclusion of fuzzy rule (5), receiving the membership function and membership value of the membership function generating circuit 122 (conditional section) and 131 (conclusion section). The membership value of the membership function generating circuits 121 and 122 is inputted into the maximum circuit 125 to determine the maximum. After this maximum is subtracted from "1" in the adder 126, the obtained value is inputted into the maximum circuit 129. The membership values of membership function generating circuits 123 and 124 are inputted into the minimum circuit 128 to determine the minimum. This minimum is inputted into the above-mentioned maximum circuit 129. The output of maximum circuit 129 is output of the conditional section of fuzzy rule (6). This output of conditional section and the membership function generated by the membership function generating circuit 132 are inputted into the minimum circuit 135 and the conclusion of fuzzy rule (6) is inferred. The three conclusions inferred by the minimum circuits 133, 134 and 135 are ORed by the maximum circuit 136, and at the same time the area is determined. The obtained OR figure and area are inputted into the center-of-gravity calculating circuit 137 to determine the center of gravity. This center of gravity is used as a vibrato parameter.

Below is given an explanation of the configuration of the fluctuation parameter inferring circuit with reference to FIG. 2 (C). The membership function generating circuits 141 and 142 are the circuits for generating the membership functions KN and IT3 of conditional section. Receiving the key number (to be determined based on the key code) and the initial touch intensity signal, respectively, they determine the corresponding membership values. The membership function generating circuits 146 and 147 are the circuits for generating the membership functions YL and YS of conclusion section. The minimum circuits 148 and 149 are the circuits for inferring the conclusion of fuzzy rules (7) and (8), respectively. The membership values of the membership functions 141 and 142 are inputted into the maximum circuit 143 to determine their maximum. The obtained maximum is the output of the conditional section of fuzzy rule (7). It is inputted into the minimum circuit 148. The membership function of the membership function generation circuit 146 is also inputted into the minimum circuit 148 to infer the conclusion of fuzzy rule (7). The output of maximum circuit 143 is subtracted from "1" generated by the "1" signal generating circuit 144 in the adder 145. This value is inputted into the minimum circuit 149. The membership function of the membership function generating circuit 147 is also inputted into the minimum circuit 149 to infer the conclusion of fuzzy rule (8). The two conclusions inferred by the minimum circuits 148 and 149 are ORed by the maximum circuit 150, and at the same time the area is determined. The obtained OR figure and area are inputted into the center-of-gravity calculating circuit 151 to determine the center of gravity. This center of gravity is used as a fluctuation parameter.

Below is given an explanation of the configuration of the level parameter inferring circuit with reference to FIG.2 (D). The membership function generating circuits 161 to 167 are the circuits for generating the membership functions IT2, AT1, IT4, AT3, IT5, AT4, and KO2 of the conditional section. Receiving the after-touch intensity signal, initial touch intensity signal and key-on time signal, respectively, these circuits output the corresponding membership values. The membership function generating circuits 171, 172 and 173 are the circuits for generating the membership functions LS, LN and LL of the conclusion section. The minimum circuits 168 and 169 and the operation circuit 170 are the circuits for inferring the conclusion of fuzzy rules (9), (10), and (11), respectively. Receiving the membership functions and membership values of the membership function generating circuits 161, 162 (conditional section) and 171 (conclusion section), the minimum circuit 168 infers the conclusion of fuzzy rule (9). Receiving the membership function and membership values of the membership function generating circuits 163, 164 (conditional section) and 172 (conclusion section), the minimum circuit 169 infers the conclusion of fuzzy rule. The operation circuit 170 receives the membership values of the membership function generating circuits 165(IT5), 166(AT4), 167(KO2) and the membership function (LL) of the membership function generating circuit 173, multiplies IT5 and KO2, and taking a minimum, the obtained product or AT4, as conditional section output, it cuts off the top of LL and infers the conclusion of fuzzy rule. The three conclusions inferred in the minimum circuits 168 and 169 and the operation circuit 170 are ORed in the maximum circuit 174 and at the same time the area is determined. The obtained OR figure and area are inputted into the center-of gravity calculating circuit 175 to determine the center of gravity. This center of gravity is used as a level parameter.

The parameters thus obtained in the above-mentioned circuits are inputted into the signal generating circuit 6 where the frequency deviation and sound volume deviation are calculated. FIGS. 5 (A) to (F) show examples of musical tone control by key operation. FIG. 5 (A) shows the intensity of initial touch and after-touch. FIGS. 5 (B) to (F) show the parameters (control volume of a musical tone element) outputted by this key touch. FIG. 5 (B) shows the pitch control by the pitch parameter. FIG. 5 (C) shows the fluctuation (frequency) control by the fluctuation parameter. FIG. 5 (D) shows the frequency (sound volume) control by the vibrato parameter. FIG. 5 (F) shows the sound volume control by the level parameter. FIG. 5 (E) is a graph indicating the total frequency control totalizing the controls by the pitch parameter, fluctuation parameter and vibrato parameter.

In this example, a key is depressed significantly strong (initial touch), and after depressing it is depressed gradually strong (after-touch). As a result of this key touch the pitch control is performed so as to keep the aimed frequency at a first relatively high level. The fluctuation control is performed so that a relatively significant fluctuation occurs at rise of the musical tone. The vibrato control is performed so that its effect is increased gradually from the midst. The level control is performed so that it is lowered significantly at first and then raised gradually. As a result of this, the frequency control is performed as shown in FIG. 5 (E). It is allowed to adopt the level control shown in FIG. 5 (F) as sound volume control. It is also allowed to add the vibrato control thereto.

Figure 6A:
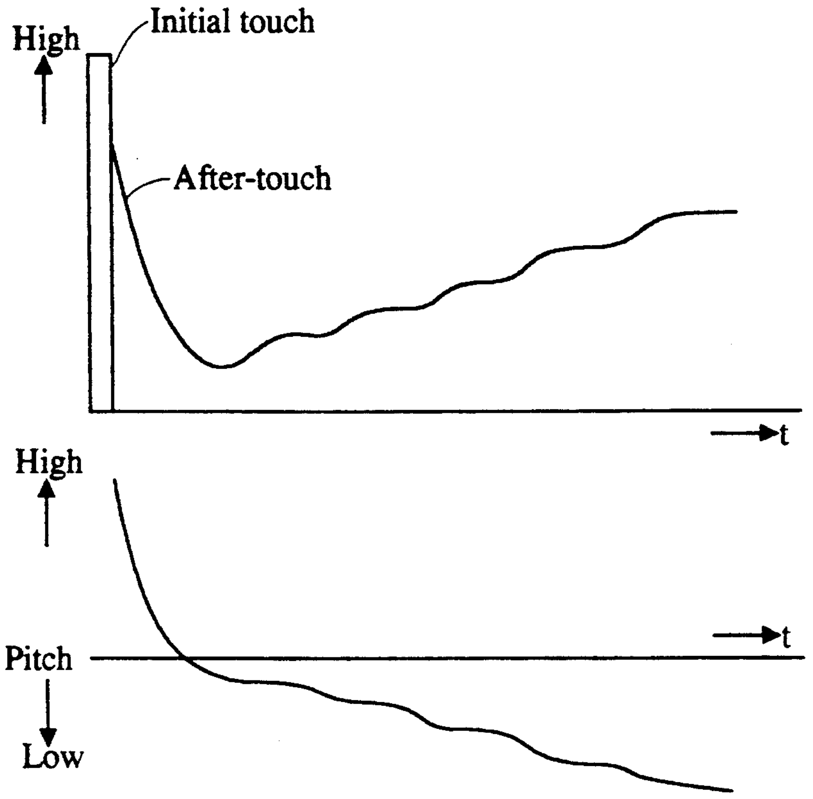
Figure 6B:
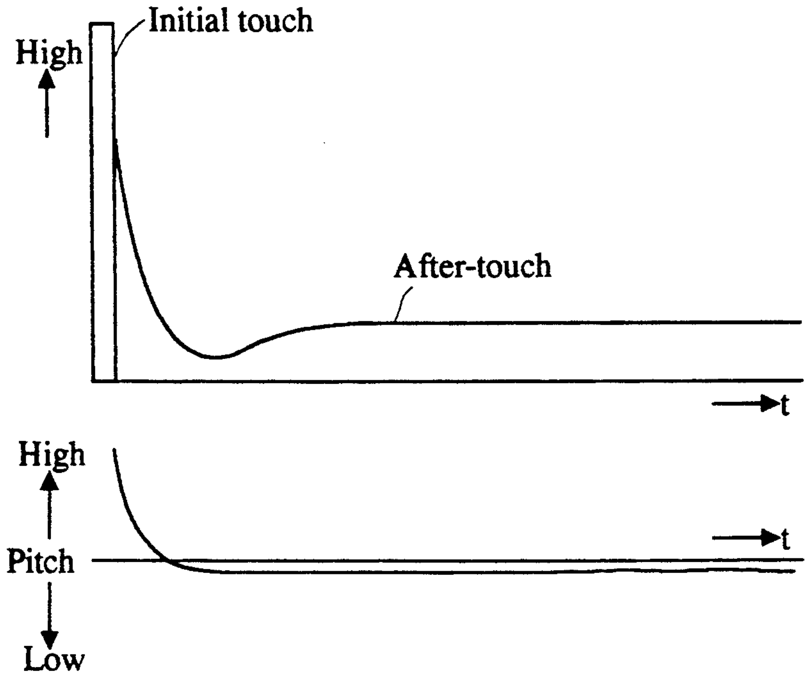

Below is given a comprehensive explanation of the change of control, based on the pitch parameter by key operation with reference to FIGS. 6 (A) and (B). Both FIG. 6(A) and FIG. 6 (B) show the intensity of initial touch and the intensity of after-touch (at the upper part), as well as the pitch change (at the lower part). FIG. 6 (A) shows an example where the initial touch is strong and the after-touch is intensified gradually and undulated. In this example, playing the musical tone which is lowered gradually and undulates from a high pitch can be obtained. FIG. 6 (B) shows an example where the initial touch is relatively strong but the after-touch is kept weak. By playing in such a manner, a musical tone which starts at a relatively high pitch and is maintained near the center pitch can be obtained.

Figure 7A:
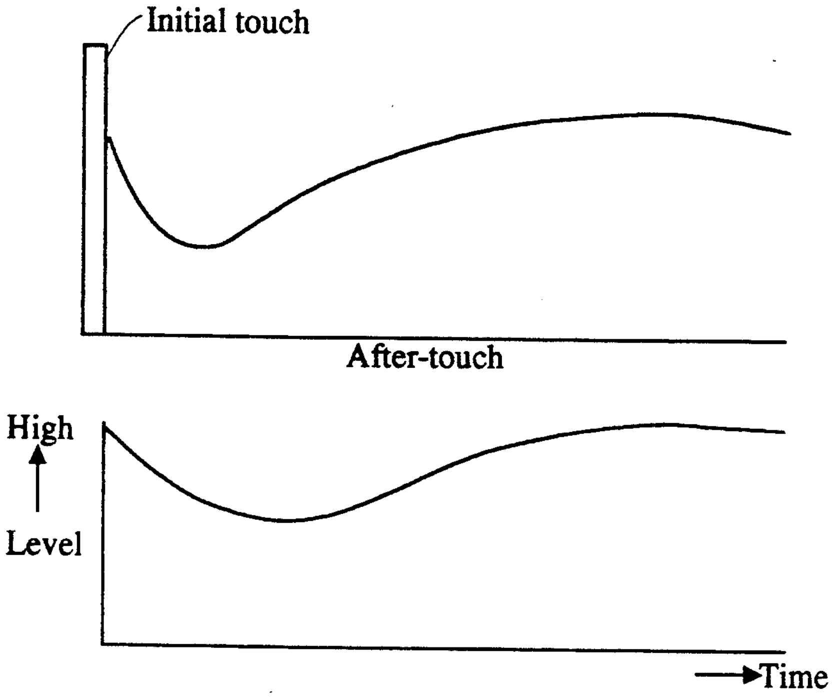
Figure 7B:
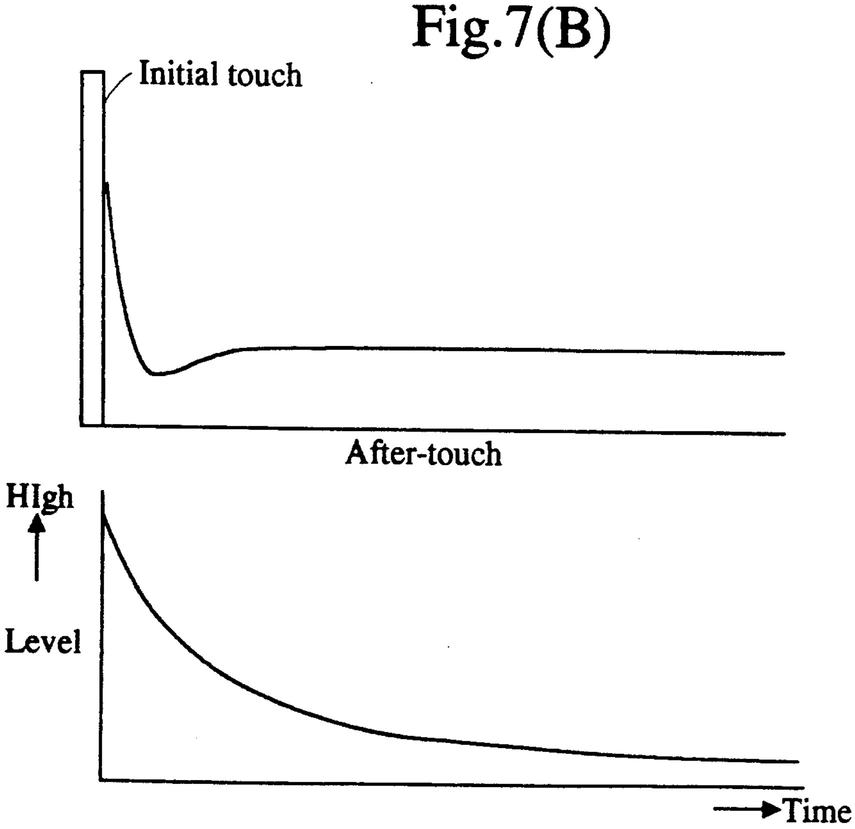

Below is given a comprehensive explanation of the sounding level control by key operation with reference to FIG. 7 (A) and FIG. 7 (B). Both FIG. 7 (A) and FIG. 7 (B) show the intensity of initial touch and the intensity of after-touch (at the upper part) as well as the sound level control (at the lower part). FIG. 7 (A) shows an example where the initial touch is relatively weak but the after-touch is increased gradually. By depressing the key in such a manner, the level can be gradually increased from the weak attack (sound rise), and the sound quality similar to that of a wind instrument or a percussion instrument can be obtained. FIG. 7 (B) shows a case where the initial touch is intense but the after-touch is kept weak. By pressing the key in such a manner, the level can be attenuated promptly from the strong attack, and the sound quality similar to that of a piano or a percussion instrument can be obtained.

In addition to the examples mentioned above, any required characteristics can be obtained by varying the fuzzy rule and membership function, so that the nature of the musical instrument can be easily changed as required.

It is possible to compose the processing section of the above-mentioned musical tone control parameter inferring circuit 5 by using either a discrete circuit or a microcomputer-applied circuit. FIGS. 8(A) to (E) are flow charts indicating the above-mentioned minimum circuit, maximum circuit and center-of-gravity calculating circuit, which are composed using a microcomputer.

Figure 8:
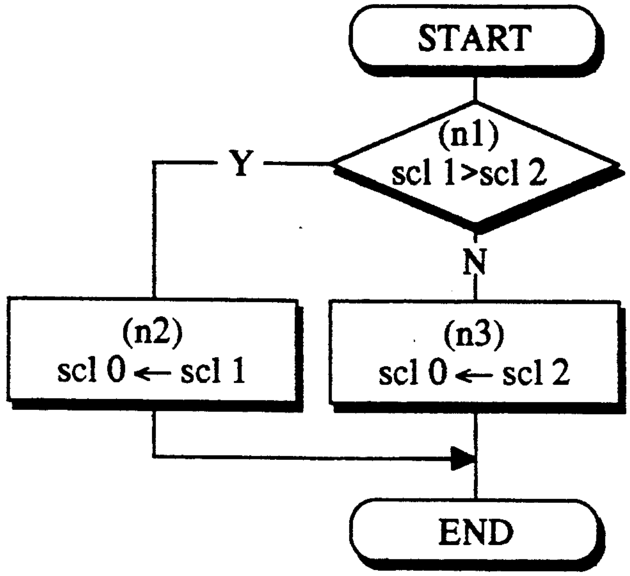
Figure 8:
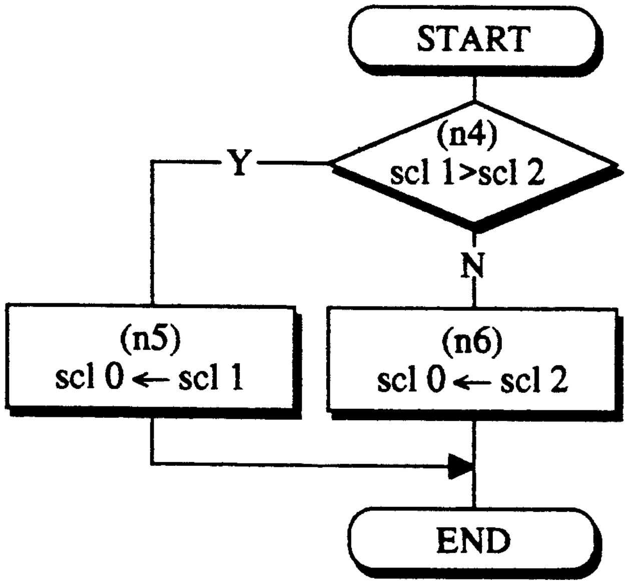
Figure 8:
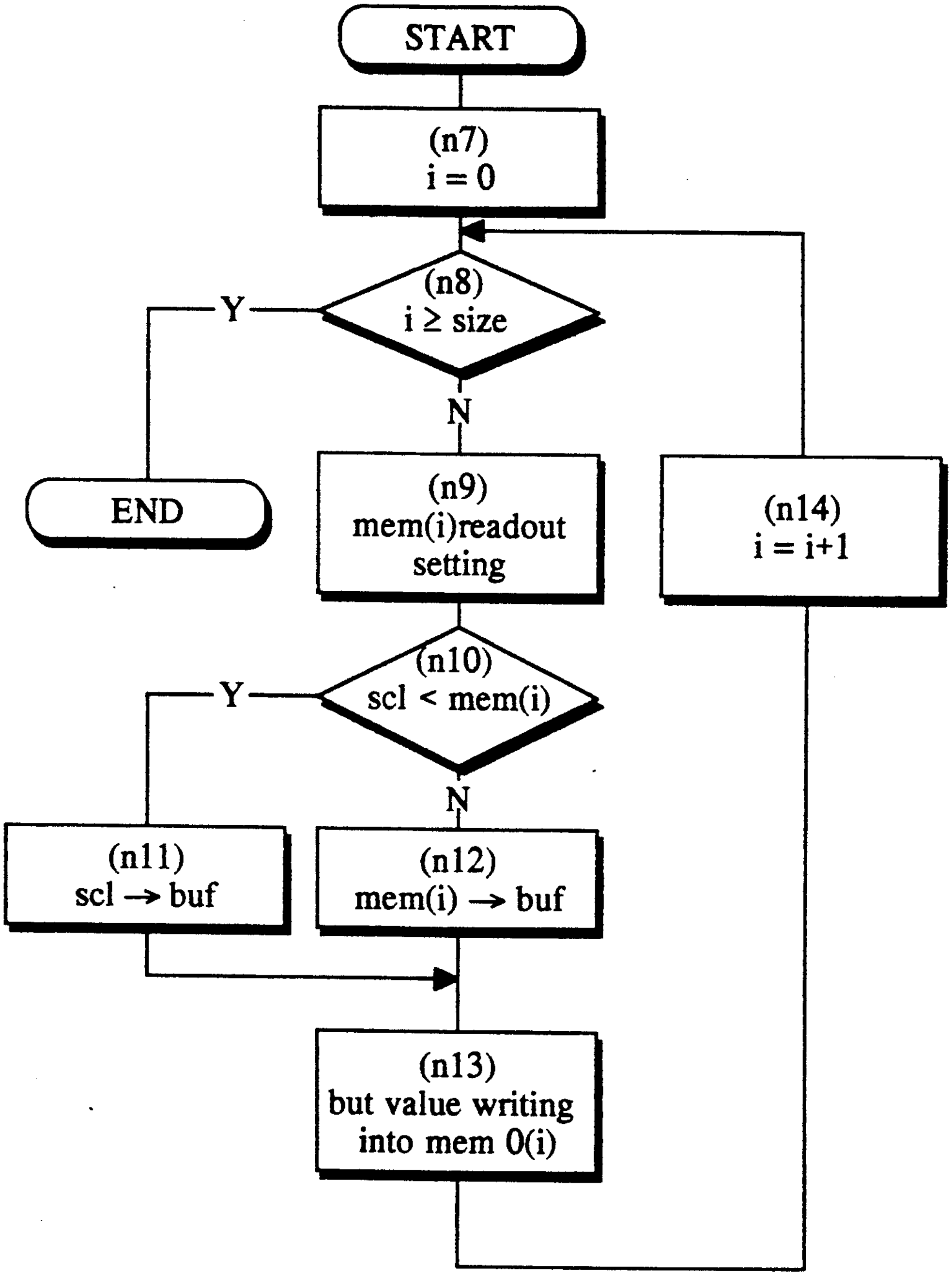
Figure 8:
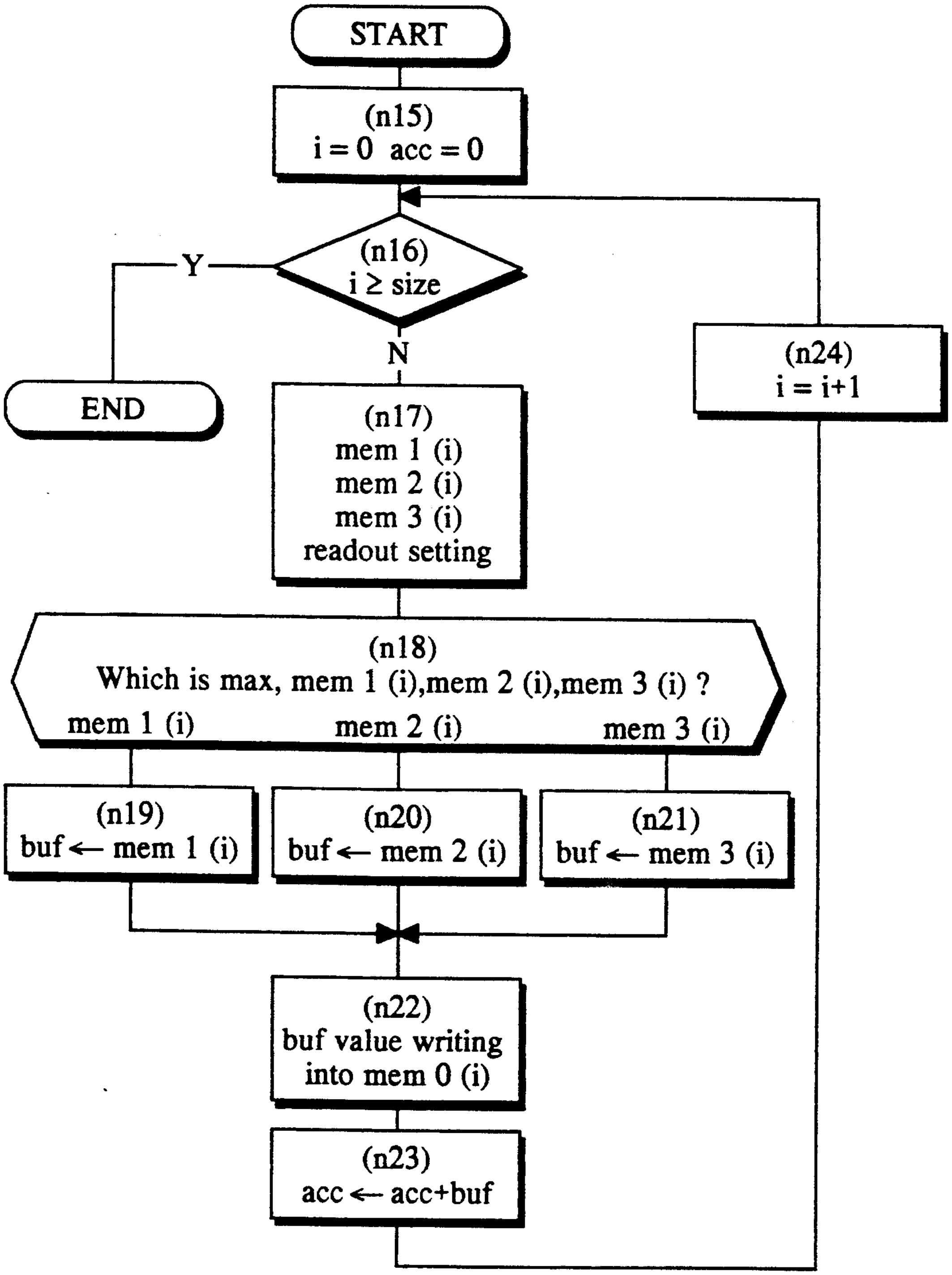
Figure 8:
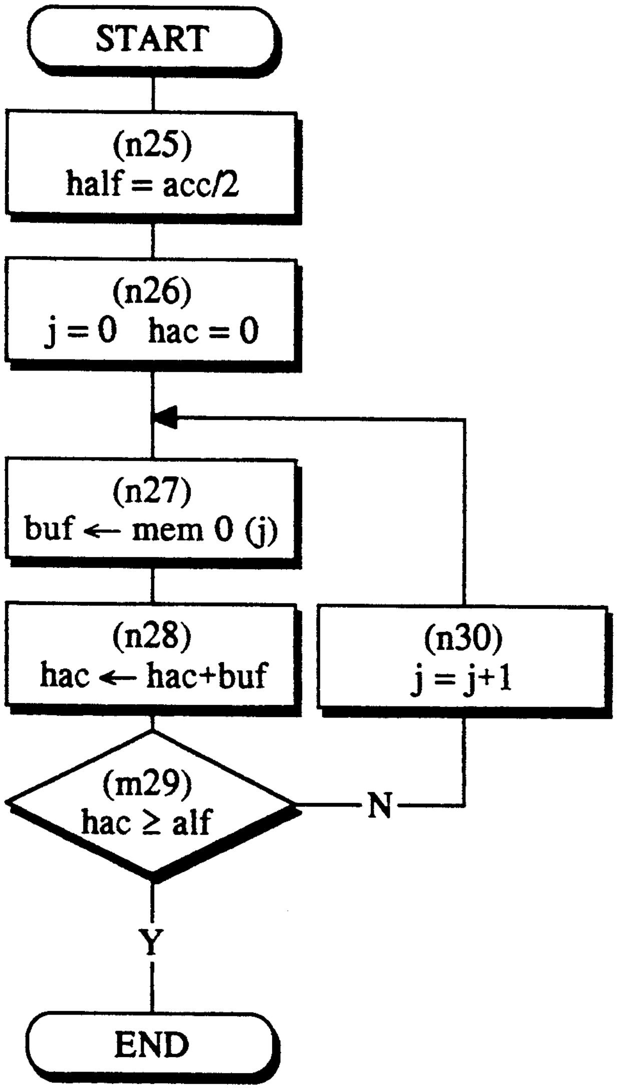

FIG. 8(A) and FIG. 8(B) are flow charts for executing the operation of the maximum circuit (106, etc.) and minimum circuit (104, etc.). In FIG. 8 (A) at first two scalar values (scl1, scl2) are read in and compared (n1. If scl1 is larger, scl1 is written in the memory scl0 (n2). If scl2 is larger, scl2 is written in the memory scl0 (n3). In FIG. 8 (B), at first the two scalar values (scl1, scl2) are read in and compared (n4). If scl1 is smaller, scll is written in the memory scl0 (n5). If scl2 is smaller, scl2 is written in the memory scl0 (n6).

FIG. 8 (C) is the flow chart for executing the operation of the minimum circuit (111 to 113). At first, i, which expresses the value of the abscissa of the membership function is set to 0 at n7. When the value of i exceeds the dimension (size) of the abscissa of the membership function, operation ends at the judgment at n8. At n9, the value (mem(i)) of membership function i is read out, and a judgment is performed as to whether this value is less than the membership value SC1 of conditional section (n10). If mem(i) is less than SC1, the value of mem(i) is written in the buffer (n12). If mem(i) exceeds SCl, the value of SCl is written in the buffer (buf)(n11). After the value of this buffer is written in the conclusion memory memo(i) corresponding to i (n13), 1 is added to i (n14), and then the process returns to n8.

FIG. 8(D) is a flow chart for executing the OR and area calculations of the maximum circuit (114, etc.). At first, at n15 0 is set to the abscissa value i and the area integration memory acc. When the value of i exceeds the dimension (size) of the abscissa of the membership function, the operation is ended by the judgment of n16. At n17 the conclusion function values (meml(i), mem2(i), mem3(i)) of three (or two) fuzzy rules at i are read, and the maximum thereof is judged at n18.

If meml(i) is maximum, mem(i) is written in the buffer (buf)(n19). If mem2(i) is maximum, mem2(i) is written in the buffer (buf)(n20). If mem3(i) is maximum, mem3(i) is written in the buffer (buf)(n21). At n22 the value of the buffer is written in mem0(i) (n22), and at the same time the value of the buffer is added to the area integration memory acc (n23). After that, 1 is added to i (n24). Then the process returns to n16.

FIG. 8(E) is a flow chart for executing the center of gravity calculation of the center-of-gravity calculating circuit (115, etc.). At first, ½ of the area (acc) obtained in FIG. 8 (D) is stored in the storage area (half) (n25). Next, 0 is set in the area integration area (hac), and j, corresponding to the abscissa of the ORed conclusion function (n26). Mem0(j) is read into the buffer (buf)(n27), and this value is integrated to the area integration area (hac) (n28). The value of integrated (hac) is compared with (half) (n29). If (hac) exceeds (half), the value of j at this time is regarded to be a center of gravity, and the operation ends. If (hac) is less than (half), 1 is added to j (n30), and the process returns to n27.

The effect parameters generated by fuzzy inference are reverberation and tremolo, in addition to vibrato and fluctuation mentioned in the above examples. The same control method can be applied also to them.

Figure 9:
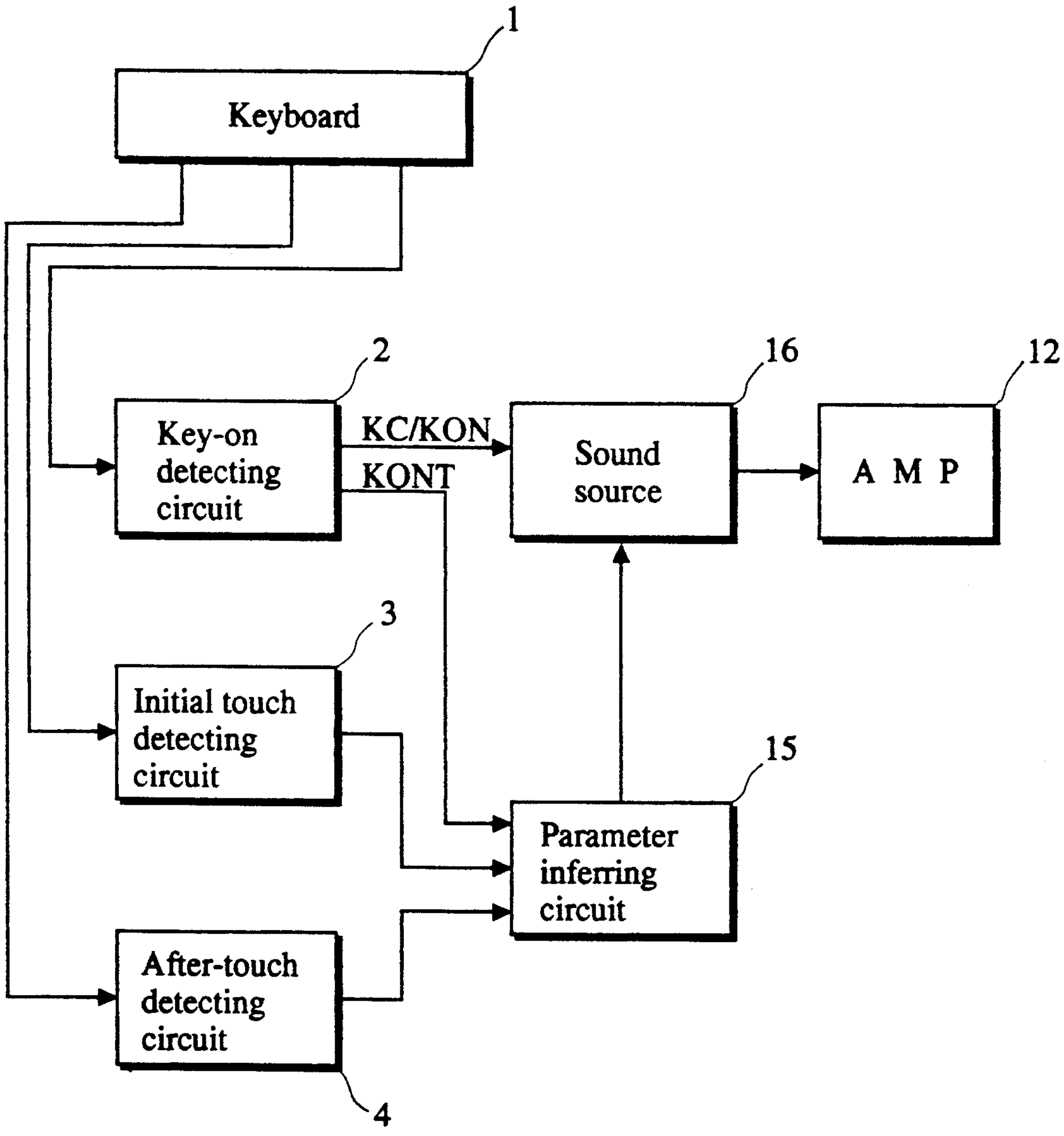
FIGS. 9 to 11 show a second embodiment of the present invention.
Figure 10:
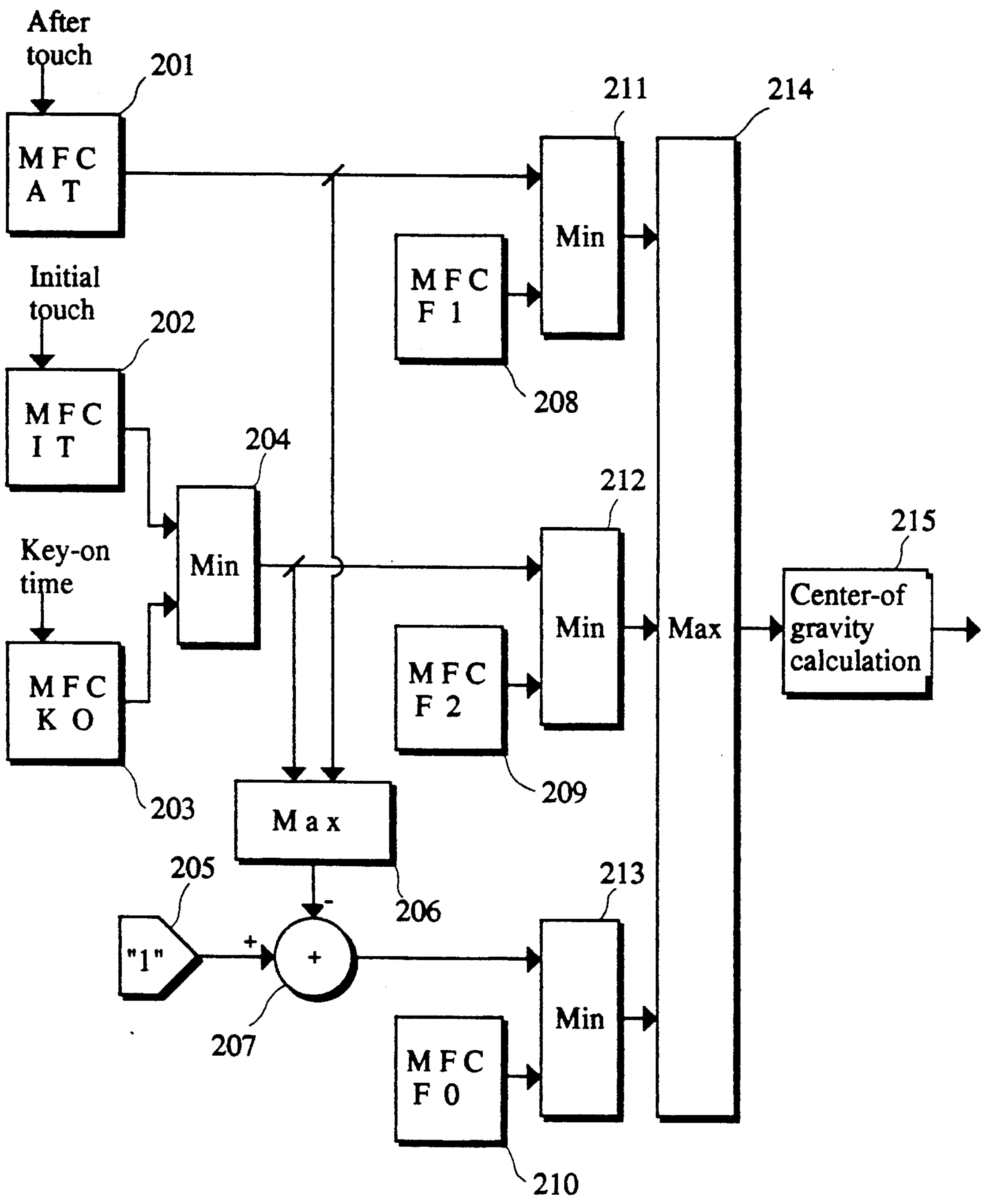
Figure 11A:
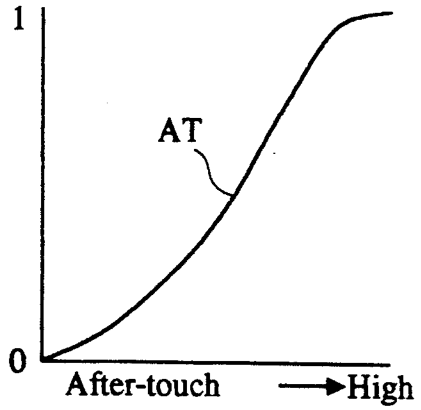
Figure 11B:
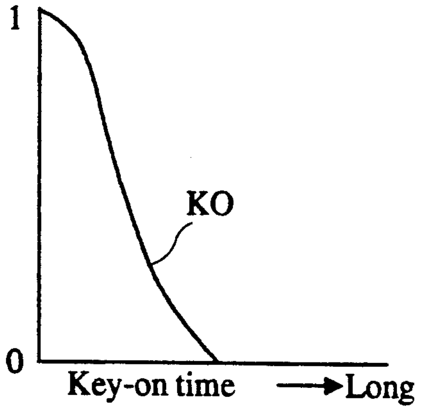
Figure 11C:
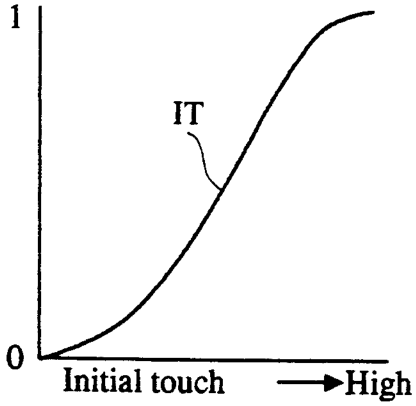
Figure 11D:
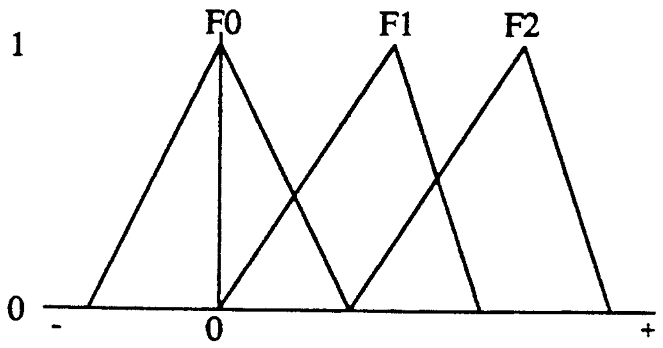

The second embodiment of the present invention is explained with reference to FIGS. 9 to 11. FIG. 9 is a block diagram of the control section of a keyboard type electronic musical instrument to which the musical tone control method of this invention is applied. The same component parts as those of the keyboard type electronic musical instrument which are shown in FIG. 1 are not explained below, but the same numbers are given. The parameter inferring circuit 15 into which the detection data are inputted from the key-on detecting circuit 2, the initial touch detecting circuit 3, and the after-touch detecting circuit infers the overtone parameter for determining the overtone composition rate of a musical tone based on the inputted data and inputs the obtained data into a sound source circuit 16. The sound source circuit 16 generates the musical tone according to this parameter, key code and key-on signal. This musical tone is inputted into an amplifier (sound system) 12, and after being amplified it is outputted as a sound. The sound source circuit 16 is allowed to be either a digital or an analog sound source, provided that the musical tone of the sound pitch corresponding to the key code can be generated. The change of overtone composition based on the overtone parameter inputted from the parameter inferring circuit 15 is allowed by controlling the overtone level in the synthesis mode if the sound source circuit is a basic sine wave synthesizing type. For a system designed to shape the musical tone waveform with a filter, the same effect is obtained by controlling the filter's transmissivity and transmission frequency. When the waveform memory type sound source is used, the same effect is obtained by selecting the waveform according to the inputted parameter. FIG. 10 is a detailed block diagram of the parameter inferring circuit 15. This circuit consists of fuzzy inferring circuits. FIGS. 11(A) to (D) show the membership functions which are used in the parameter inferring circuit 15.

The fuzzy inference to be performed in this parameter inferring circuit 15 is the following:

<<If "the after-touch is significant", then "high-order overtone composition rate increases insignificantly">> (12)

<<If "the initial touch is significant" and "soon after key-on" then "high-order overtone composition rate increases">> (13)

<<If "the after-touch is significant" nor "initial touch is significant" and "soon after key-on" then "high order overtone composition rate is not changed">> (14)

The overtone composition rate is determined based on the cumulative result of these inferences. The membership function of each proposition composing this rule is set as shown in FIGS. 11(A) to (D). Here, AT, KO and IT are the membership functions expressing the fuzzy set (conditional section) "after-touch is significant", "soon after key-on", and "initial touch is significant", respectively. F0, F1, and F2 are the membership functions corresponding to the conclusion "high-order overtone composition rate is not changed", "high-order overtone composition rate increases insignificantly", and "high-order overtone composition rate increases", respectively. The showy sound, including many high-order overtones, can be generated during playing by executing the above-mentioned fuzzy rule with the aid of such a membership function (a so-called distortion-like effect can be obtained). It is also possible to perform controls to reduce the high-order overtone composition rate. In this case, the sound can be darkened. Thus, by varying the fuzzy rules and membership functions, any overtone composition (sound tone) characteristic can be obtained in addition to those shown above.

The parameter inferring circuit 15 is composed as shown in FIG. 10 so as to execute the above-mentioned fuzzy rules. The membership function generating circuits (MFC: Membership Function Circuit) 201, 202 and 203 are the circuits for generating the membership functions AT, IT and KO. Receiving the after-touch intensity signal, initial touch intensity signal and key-on time signal, respectively, they determine the corresponding membership values. The membership function generating circuits 208 to 210 are the circuits for generating the membership functions F1, F2 and F0. The minimum circuits 211, 212 and 213 are the circuits for inferring the conclusion of the fuzzy rules (12), (13) and (14). The membership function and membership values of the membership function are received in generating circuits 201 (conditional section) and 208 (conclusion section), and the minimum circuit 211 infers the conclusion of the fuzzy rule (12). The membership values of the membership functions 202 and 203 are inputted into the minimum circuit 204, and a logical product (minimum) is determined and inputted into the minimum circuit 212 as a value of the conditional section of fuzzy rule (13). The membership function (F2) of the membership function generating circuit 209 is inputted into the minimum circuit 212 and the conclusion of fuzzy rule (13) is inferred. The outputs of minimum circuit 204 and membership function generating circuit 201 are ORed (maximum is determined) by the maximum circuit 206, and it is subtracted from "1" in the subtractor 209 (the complementary set is determined). This value is inputted into the minimum circuit 213 as a value of the conditional section of fuzzy rule (14). The membership function (F0) of the membership function generating circuit 210 is inputted into the minimum circuit 213, and the conclusions of fuzzy rule (14) is inferred. The three conclusions inferred by the minimum circuits 211, 212, and 213 are ORed by the maximum circuit 214, and at the same time the area is determined. The obtained OR figure and area is inputted into the center-of-gravity calculating circuit 215, so that the center-of- gravity is determined by this center-of-gravity calculating circuit 215.

This center of gravity is used as an overtone parameter for controlling the overtone composition rate.

In the embodiment which is described above, the sound source circuit 16 receives the overtone parameter outputted from the parameter inferring circuit 15 and the overtone composition of a generated musical tone is controlled. This invention is applicable to a system where the specific musical tone is generated by the sound source and its overtone composition is changed by the following filter.

Figure 12:
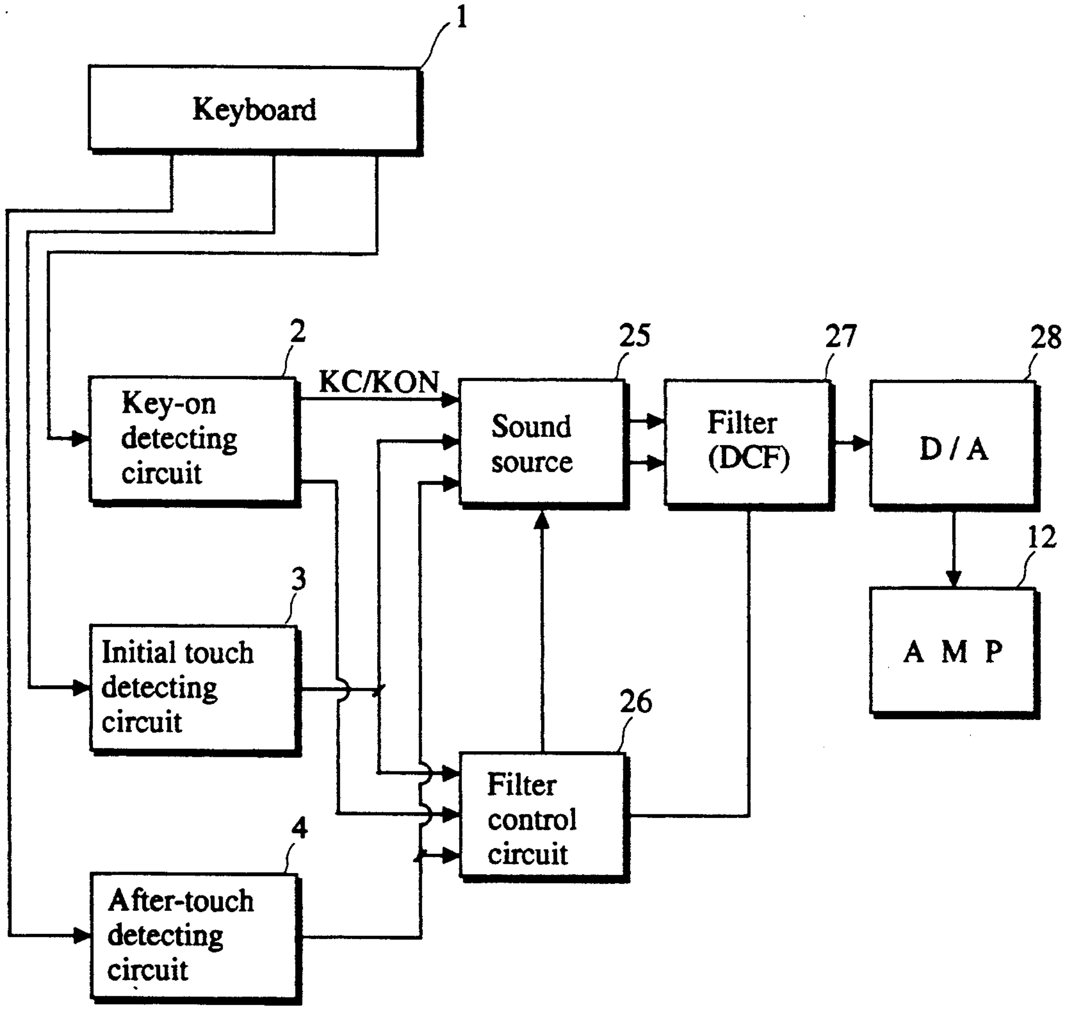
FIG. 12 shows a third embodiment of the present invention. It is a block diagram of other keyboard type electronic musical instruments to which the overtone control method is applied.

FIG. 12 shows a third embodiment of the present invention. The parts having the same composition as that explained above in the previous embodiments are marked with the same numbers, but their explanation is not given. The key-on signal, key code, initial touch signal, and aftertouch signal are inputted into the sound source circuit 25, and the specific musical tone signal is generated according to this play information. The key-on time signal, initial touch signal and after-touch signal are inputted into the filter control circuit 26, and the same fuzzy inference as that performed by the above-mentioned parameter inferring circuit 15 is performed according to the play information. The transmission characteristic of the filter (digital control filter) 27 connected to the sound source circuit 25 is controlled according to the overtone parameter obtained by this inference, so that the overtone composition rate of the musical tone is controlled. The musical tone signal which passes through the filter 27 is converted to an analog signal by the D/A converting circuit 28, and the obtained signal is amplified by the amplifier 12 and outputted therefrom.

FIGS. 13, 14, 15, 16, and 17 show a fourth embodiment of the present invention. This embodiment is applied to keyboard type electronic musical instruments. Since the keyboard type electronic musical instrument to which the invention is applied is similar to that explained in the first embodiment (FIG. 1), its explanation is omitted. The parameter inferring circuit 5 of the above-mentioned keyboard type electronic musical instrument infers the extent of legato when the key is turned on. It infers the extent of staccato when the key is turned off. Here, the legato playing method is a method featuring smooth connection of continued sounds which gives a feeling of calmness, or a feeling of phrasing. The tenuto playing method is a method for prolonging the sound up to the limit of a note value (the length of a musical note) without fully lowering the sound volume. This playing method is used for giving clear powerfulness. The staccato playing method is a method in which the sound is cut shorter than the note value. It is used for giving a feeling of lightness. The above-mentioned inference is performed as a fuzzy inference. The following three fuzzy rules are used for this inference:

"If there is an insignificant difference between the after-touch of the key pressed just before and the subsequent initial touch, and the subsequent key-on overlaps with the preceding key-on, the executed play is legato play, wherein the attack is reduced, the envelope is connected smoothly, and portament is applied insignificantly". Accordingly, the rise of a musical tone is accompanied by an attack (pulse-like level rise). Since the legato play does not need such an attack, it is dulled, and the musical interval is slid slightly so as to give a sliding effect.

"If the key-on time is long and the after-touch is significant, the level and pitch are raised gradually since the employed playing method is tenuto playing method". Accordingly, when the sound is prolonged fully up to the limit of the note value, there appears an impression "sound suppression". The level and pitch are gradually raised so as to emphasize this impression.

"If the initial touch is significant, and the key is turned off soon after it is turned on, the employed playing method is the staccato playing method, and therefore the release time is prolonged slightly at low level".

The ideal staccato is not only a simple short cutting of sound; it must give slight reverberations which are obtained when a thing is hit. Therefore, when the staccato play is detected, a low level release is given.

Figure 13:
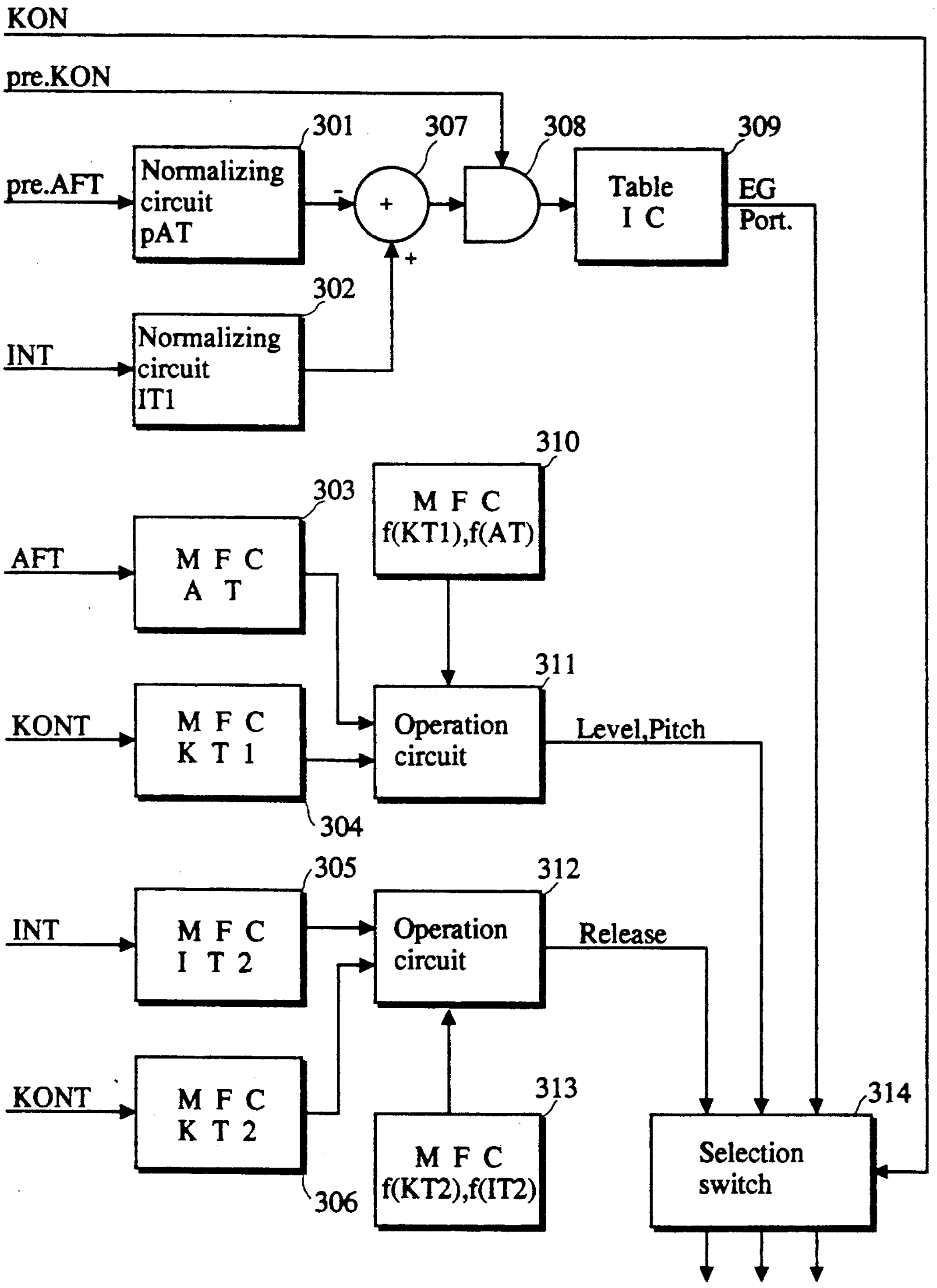
FIG. 13 to FIG. 18 show a fourth embodiment of the present invention.
Figure 14A:
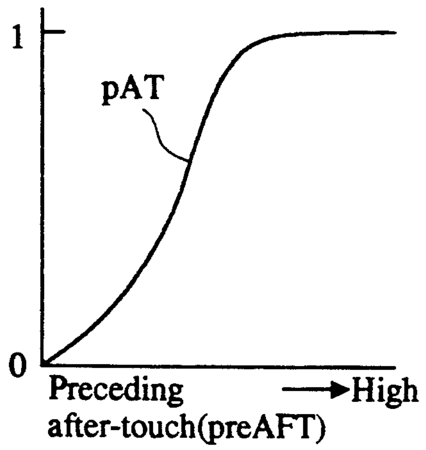
Figure 14B:
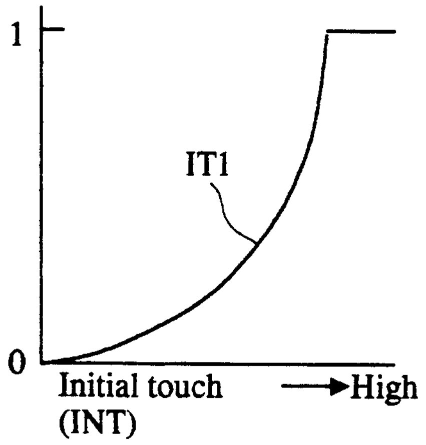
Figure 14C:
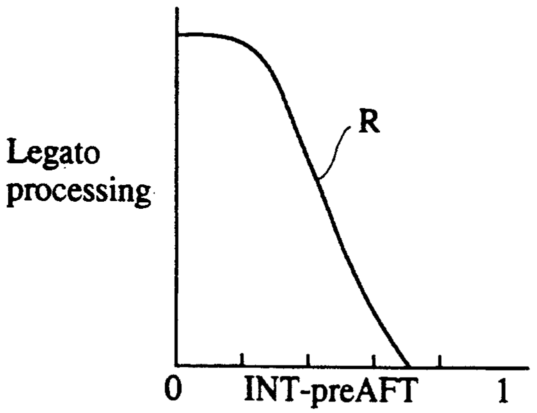
Figure 15A:
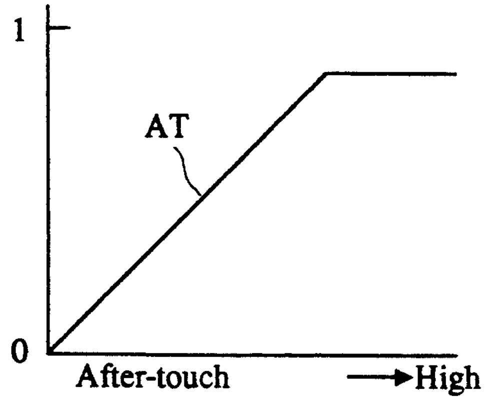
Figure 15B:
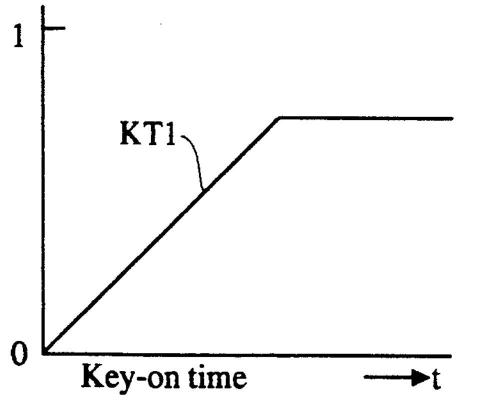
Figure 15C:
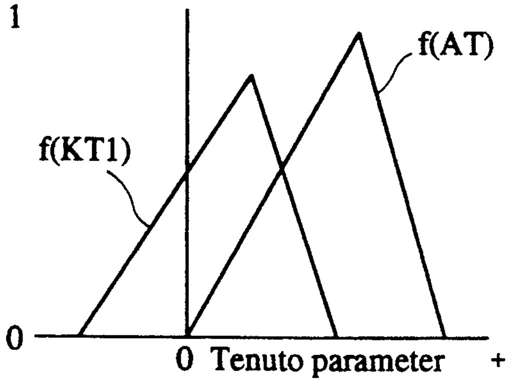
Figure 16A:
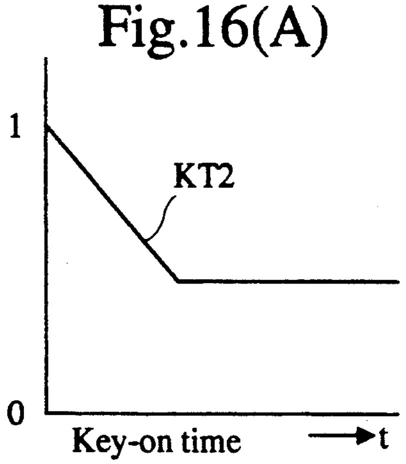
Figure 16B:
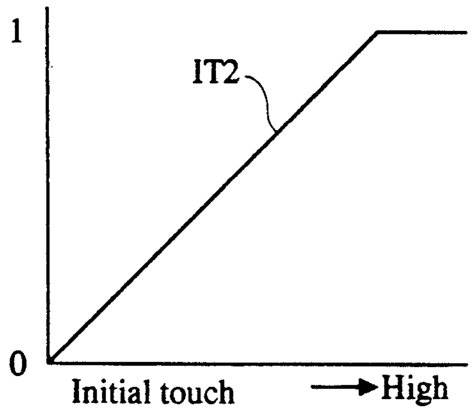
Figure 16C:
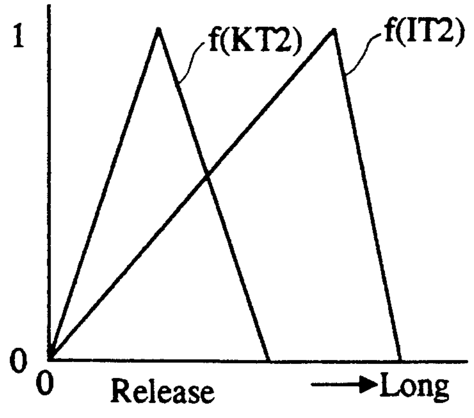
Figure 17A:
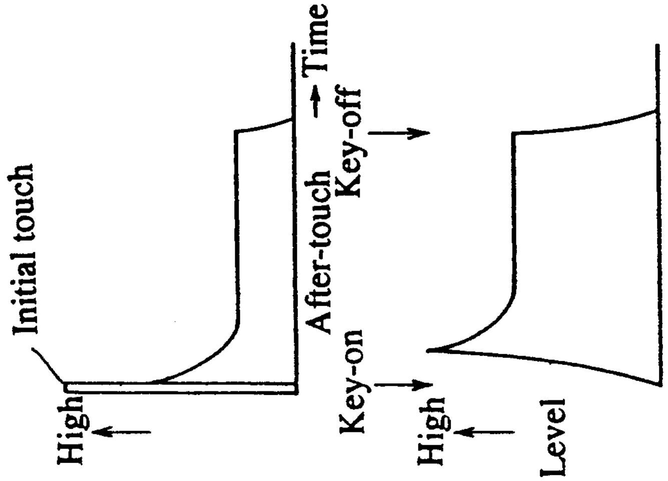
Figure 17B:
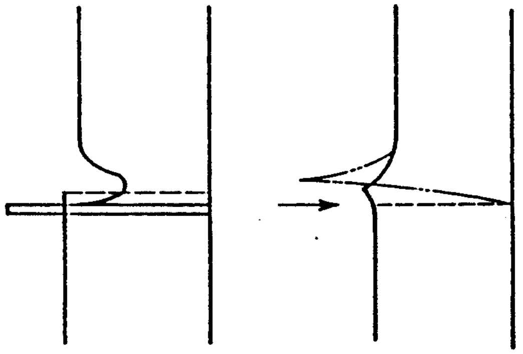
Figure 17C:
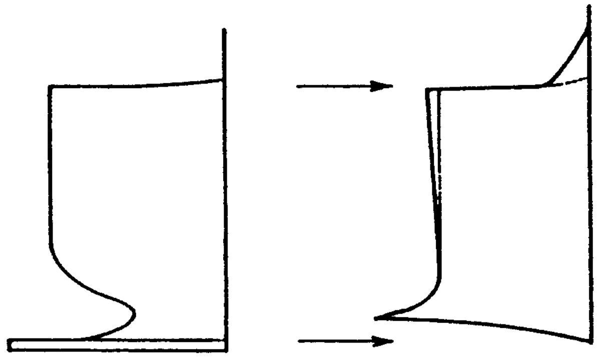
Figure 17D:
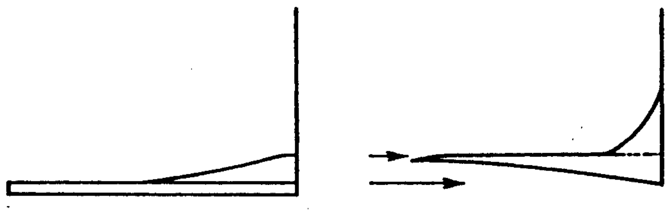

So as to execute these inferences, the circuit shown in FIG. 13 is composed, and the membership functions shown in FIG. 14, 15 and 16 are set.

The normalizing circuits 301 and 302, the adder 307, the gate circuit 308, the table IC 309 and FIG. 14 (A), (B), and (C) are the circuits for inferring the extent of legato and membership functions. The initial touch intensity signal (INT) is inputted into the normalizing circuit 302. The after-touch intensity signal (preAFT) of the key (hereinafter referred to as the preceding key) which is tuned on just before the subsequent key-on signal is inputted into the normalizing circuit 301. The normalizing circuits 302 and 301 generate the membership functions of FIG. 14 (A) and FIG. 14 (B). The inputted INT and preAFT are normalized (converted to the numerics between 0 to 1). Both the normalizing circuits 301 and 302 are connected to the adder 307. They output the normalized INT and preAFT. In the adder 307 preAFT is subtracted from INT to get a difference. The adder 307 is connected to the table IC309 through the gate circuit 308. The gate circuit 308 gives a gate signal which is opened and closed by the key-on signal (preKON) of the preceding key. The table IC309 generates the membership function of FIG. 14 (C), and determining the extent of legato from the difference between INT and preAFT, and outputs it. This value is inputted into the signal generating circuit 6 through a selection switch 314. The key-on signal (KON) is inputted into the selection switch 314. When KON rises (at the time of initial touch) the table IC is connected to the signal generating circuit 6. The output (extent of legato) of the table IC309 is used as a parameter for connecting smoothly the envelope and pitch.

The membership function generating circuits 303, 304 and 310, the operation circuit 311 and FIG. 14 (A), (B) and(C) are the circuits for inferring the extent of tenuto and the membership functions. The membership function generating circuits 303 and 30 input the membership value of conditional section into the operation circuit 311 which executes the fuzzy inference, and the membership function generating circuit 310 inputs the membership function of the conclusion section. The after-touch intensity signal (AFT) and key-on time signal (KONT) are inputted into the membership function generating circuits 303 and 304. The extent of membership (intensity of after-touch, duration of key-on time) is determined based on the membership function shown in FIG. 15 (A) and FIG. 15 (B). This value is inputted into the operation circuit 311. In the operation circuit 311, the top of the membership functions f(KT1) and f(AT) of the conclusion section is cut with the inputted membership value, and the center of gravity is outputted as a tenuto parameter (extent of tenuto). The selection switch 314 inputs this value into the signal generating circuit 6 during KON. This value is used as a parameter for envelope control and pitch control.

The membership function generating circuits 305, 306 and 313, the operation circuit 312 and FIG. 16 (A), (B), and (C) are the circuits and membership functions for inferring the extent of staccato. The membership function generating circuits 305 and 306 input the membership value of the conditional section into the operation circuit 312 which executes the fuzzy inference, and the membership function generating circuit 313 inputs the membership function of the conclusion section thereinto. The initial touch intensity signal (INT) and key-on time signal (KONT) are inputted into the membership function generating circuits 305 and 306. The extent of membership is determined according to the membership functions (IT2, KT2) of FIG. 16 (A) and FIG. 16(B). This value is inputted into the operation circuit. In the operation circuit the top of the membership functions f(KT2) and f(IT2) of the conclusion section is cut with the inputted membership value, and the center of gravity thereof is outputted as the release time (extent of staccato). This value is inputted into the signal generating circuit 6 when the selection switch 314 and KON fall down. This value is used as a parameter for envelope control (release control).

The musical tone control method as shown in FIG. 17 (B), (C) and (D) is performed by executing the above-mentioned fuzzy rules with the aid of these inferring circuits and membership functions. FIG. 17 (A) shows the ordinary key touch (when the above-mentioned control is not performed) and the musical sound level. FIG. 17 (A), (B), (C), and (D) show the intensity of initial touch and the temporary intensity of after-touch (at the upper part) and the sound level of the musical tone (at the lower part). In FIG. 17 (A) an attack is formed at a rise of the musical tone by the initial touch, and during the key-on period a constant level is kept. Concurrently with a key-off, the musical tone stops.

FIG. 17 (B) shows the legato processing. The broken line in the upper part indicates the intensity of after-touch of the preceding key. If this key pressing is done with the preceding key turned on, the attack by this initial touch (two-dot broken line in the lower part) is weakened and smoothed, and the level is continued. At this time the pitch is also smoothly tied by portament.

FIG. 17 (C) shows the case where the tenuto processing is performed. If the after-touch is strongly continued after key-on, the level and pitch are raised gradually. As a result of this, the impression "sound suppression" peculiar to the tenuto play can be emphasized.

FIG. 17 (D) shows the case where the staccato processing is not performed. If a key-off is performed after a short time with an intensive initial touch, low level reverberation remains, thereby resulting in soft sound cuts.

The above-mentioned operation circuits 311 and 312 can be composed either as discrete circuit or by using a microcomputer. In the case where the circuits are composed by using a microcomputer, their operation is as shown in the flow chart of FIG. 8.

In the above-mentioned embodiments, explanations are given as to an electronic musical instrument which is played in real time mode. Similar control is also applicable to the electronic musical instrument which stores play information in advance in the memory and performs automatic play.

Thus, a significant feature of the musical tone control method of this invention for an electronic musical instrument is that as the fuzzy inference is applied for determining the musical tone control parameters such as pitch, sounding level, effect, overtone composition, playing method, etc., it is possible to determine the musical tone control parameters, taking into account comprehensively many types of play information and using a simple circuit configuration. This makes it possible to easily and rapidly execute delicate musical tone control, thereby giving a delicate nuance to the play. Moreover, the characteristics of the musical instrument can be changed easily by changing the fuzzy rules and membership functions, which allow the musical instrument to be variegated.

What is claimed is:

1. A musical tone controlling method for an electronic musical instrument comprising the steps of:

detecting plural musical tone information signals, each of said musical tone information signals having a predetermined value;

determining a membership value for each of said musical tone information signals by providing a plurality of membership functions and comparing the status of said signals with said plurality of membership functions;

providing a tone control function based upon said membership values; and controlling a musical tone of said musical instrument in accordance with said tone control function.

2. A musical instrument controlling method for an electronic musical instrument having means for generating a plurality of membership functions for defining musical tone controlling characteristics, comprising the steps of:

detecting plural musical tone information signals, each of said musical tone information signals having a predetermined value;

selecting membership values from said plurality of membership functions for each of said musical tone information signals;

defining a tone controlling function based on said membership values; and controlling a musical tone of said instrument by use of said tone controlling function.

3. A musical tone controlling method for an electronic musical instrument having means for generating a plurality of membership functions, wherein said each of said membership functions defines a musical tone controlling parameter, comprising the steps of:

detecting a plurality of musical performance information, each having a predetermined value;

deriving a plurality of limited tone controlling functions from said musical performance information and said membership functions;

producing a new tone controlling function from a combination of said plurality of limited tone controlling functions; and controlling a musical tone of said instrument by said new tone controlling function.

4. An electronic musical instrument, comprising:

mean for generating a plurality of membership functions for deciding a musical tone controlling function;

a plurality of detecting means for detecting musical tone controlling information;

modifying means for modifying said plurality of membership functions by said musical tone controlling information;

combining means for combining said plurality of membership functions modified by said modifying means to thereby produce a new controlling function; and means for controlling said musical tone by use of said new controlling function.

5. A musical tone control method for controlling an electronic musical instrument comprising the steps of:

inputting musical performance data including note-on data representing note generation and at least two kinds of tone control data representing a desired musical performance state of said instrument;

performing a fuzzy inference operation based on said at least two kinds of control data and generating an operation result from said fuzzy inference operation;

generating a parameter according to said operation result; and controlling said musical tone responsive to said note-on data and based on said parameter.

6. A musical tone control method as set out in claim 5, wherein said generating step includes the step of selecting vibrato of said tone as said parameter.

7. A musical tone control method as set out in claim 5, wherein said generating step includes the step of selecting tremolo of said tone as said parameter.

8. A musical tone control method as set out in claim 5, wherein said generating step includes the step of selecting overtone of said tone as said parameter.

9. A musical tone control method for controlling an electronic musical instrument, comprising the steps of:

inputting musical performance data including note-on data representing note generation and at least two kinds of tone control data representing a desired musical performance state of said instrument;

performing a fuzzy inference operation based on said at least two kinds of control data and generating an operation result from said fuzzy inference operation;

generating a parameter according to said operation result; and controlling said musical tone responsive to said note-on data and based on said parameter;

wherein said generating step includes the step of selecting reverberation of said tone as said parameter.

10. A musical tone control method for controlling an electronic musical instrument, comprising the steps of:

inputting musical performance data including note-on data representing note generation and at least two kinds of tone control data representing a desired musical performance state of said instrument:

performing a fuzzy inference operation based on said at least two kinds of control data and generating an operation result from said fuzzy inference operation;

generating a parameter according to said operation result; and controlling said musical tone responsive to said note-on data and based on said parameter;

wherein said generating step includes the step of selecting volume data of said note as said parameter.

11. A musical tone control method for controlling an electronic musical instrument, comprising the steps of:

inputting musical performance data including at least note-on data representing note generation;

detecting time data representing the time lapse from the last time when said note-on data changes;

performing a fuzzy inference operation based on said time data and deriving an operation result from said fuzzy inference operation;

generating a parameter according to said operation result; and controlling said musical tone responsive to said note-on data and based on said parameter.

12. A musical tone control method according to claim 11, further comprising the step of inputting control data representing a desired musical performance state of said instrument.

13. A musical tone control method for controlling an electronic musical instrument, comprising the steps of:

inputting musical performance data including at least note-on data representing note generation and control data representing a desired musical performance state of said instrument;

detecting time data representing the time lapse from the last time when said note-on data changes;

performing a fuzzy operation based on said time data and said control data and deriving an operation result from said fuzzy operation;

generating a parameter according to said operation result; and controlling said musical tone responsive to said note-on data and based on said parameter.

14. A musical tone control method for controlling an electronic musical instrument according to a performance technique, comprising the steps of:

inputting musical performance data including note-on date representing note generation and at least two kinds of tone control data representing a desired musical performance state of said instrument;

performing a fuzzy inference operation based on said at least two kinds of tone control data and generating an operation result representing the degree of said performance technique;

generating a parameter according to said operation result; and to said note-on data and based on said parameter.

15. A musical tone control method according to claim 14, wherein said performing step includes the step of selecting tenuto as said performance technique.

16. A musical tone control method according to claim 14, wherein said performing step includes the step of selecting staccato as said performance technique.

17. A musical tone control method according to claim 14, wherein said performing step includes the step of selecting legato as said performance technique.

18. A musical tone control method according to claim 14, wherein said inputting step includes the step of selecting at least one of said at least two kinds of tone control data from the control data of the previously controlled musical tone.

* * * * *